(12) United States Patent
Vaillancourt et al.

(10) Patent No.: US 10,211,861 B2
(45) Date of Patent: *Feb. 19, 2019

(54) MULTI-MODE INTEGRATED FRONT END MODULE

(71) Applicant: Skyworks Solutions, Inc., Woburn, MA (US)

(72) Inventors: William Gerard Vaillancourt, Methuen, MA (US); Kenneth Michael Searle, Dunmow (GB)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/072,234

(22) Filed: Mar. 16, 2016

(65) Prior Publication Data

US 2016/0276983 A1 Sep. 22, 2016

Related U.S. Application Data

(60) Provisional application No. 62/134,492, filed on Mar. 17, 2015.

(51) Int. Cl.

| H03F 1/02 | (2006.01) |
|---|---|
| H03F 3/24 | (2006.01) |
| H03F 3/195 | (2006.01) |
| H04B 1/04 | (2006.01) |
| H03F 1/22 | (2006.01) |

(Continued)

(52) U.S. Cl.
CPC ......... *H04B 1/0458* (2013.01); *H03F 1/0277* (2013.01); *H03F 1/22* (2013.01); *H03F 3/195* (2013.01); *H03F 3/245* (2013.01); *H03F 3/68* (2013.01); *H03F 3/72* (2013.01); *H04B 1/18* (2013.01); *H04B 1/401* (2013.01); *H03F 2200/294* (2013.01); *H03F 2200/387* (2013.01); *H03F 2200/451* (2013.01); *H03F 2203/7209* (2013.01)

(58) Field of Classification Search
USPC ...... 330/307, 310–311, 295, 124 R, 84, 286, 330/53–54
See application file for complete search history.

(56) References Cited

U.S. PATENT DOCUMENTS

| 6,046,640 A | 4/2000 | Brunner |
| 6,252,463 B1 | 6/2001 | Kobayashi |

(Continued)

FOREIGN PATENT DOCUMENTS

| JP | H10190379 | 7/1998 |
| JP | H11234148 | 8/1999 |

(Continued)

Primary Examiner — Hieu Nguyen
(74) Attorney, Agent, or Firm — Knobbe, Martens, Olson & Bear, LLP

(57) ABSTRACT

Systems and methods are disclosed for a multi-mode radiofrequency (RF) module comprising a semiconductor die and a power amplifier residing on the die. The power amplifier is configured to operate in a first RF mode corresponding to a first RF wireless technology standard and a second RF mode corresponding to a second RF wireless technology standard. A first set of circuitry within the power amplifier is active in the first RF mode and a second set of circuitry within the power amplifier is active in the second RF mode.

21 Claims, 15 Drawing Sheets

(51) Int. Cl.
*H03F 3/68* (2006.01)
*H03F 3/72* (2006.01)
*H04B 1/18* (2006.01)
*H04B 1/401* (2015.01)

(56) References Cited

U.S. PATENT DOCUMENTS

| | | |
|---|---|---|
| 6,297,701 B1 | 10/2001 | Visocchi |
| 6,429,721 B1 | 8/2002 | Armitage |
| 6,765,268 B2 | 7/2004 | Akamine et al. |
| 8,427,240 B2 | 4/2013 | Hsieh et al. |
| 8,660,514 B1 | 2/2014 | Wyse |
| 8,908,667 B1 * | 12/2014 | Wong ............... H04B 1/04 370/327 |
| 8,971,830 B2 * | 3/2015 | Hadjichristos ........ H03F 1/0277 455/127.4 |
| 9,048,284 B2 | 6/2015 | McPartlin et al. |
| 9,419,073 B2 | 8/2016 | McPartlin et al. |
| 9,712,117 B2 | 7/2017 | Searle |
| 9,761,700 B2 | 9/2017 | McPartlin |
| 9,818,821 B2 | 11/2017 | McPartlin et al. |
| 9,899,960 B2 | 2/2018 | Searle |
| 2003/0129958 A1 | 7/2003 | Behzad |
| 2007/0116015 A1 | 5/2007 | Jones |
| 2009/0051424 A1 | 2/2009 | Liu |
| 2010/0029239 A1 | 2/2010 | Asuri |
| 2010/0141337 A1 | 6/2010 | Chen |
| 2013/0316669 A1 | 11/2013 | Davierwalla et al. |
| 2014/0001567 A1 | 1/2014 | McPartlin |
| 2014/0001602 A1 | 1/2014 | McPartlin |
| 2014/0001608 A1 | 1/2014 | McPartlin |
| 2014/0170999 A1 | 6/2014 | Aparin |
| 2014/0210554 A1 | 7/2014 | Abdelhalem |
| 2014/0213209 A1 | 7/2014 | Holenstein |
| 2014/0266461 A1 | 9/2014 | Youssef |
| 2017/0331434 A1 | 11/2017 | Searle |

FOREIGN PATENT DOCUMENTS

| | | |
|---|---|---|
| WO | WO 01-28087 | 4/2001 |
| WO | WO 2013-150564 | 10/2013 |

\* cited by examiner

MULTI-MODE INTEGRATED FRONT END MODULE

CROSS-REFERENCE TO RELATED APPLICATION

This application claims the benefit of priority under 35 U.S.C. § 119(e) of U.S. Provisional Patent Application No. 62/134,492, filed Mar. 17, 2015 and titled "MULTI-MODE INTEGRATED FRONT END MODULE", the entire disclosure of which is hereby incorporated by reference in its entirety herein.

BACKGROUND

Technical Field

The present disclosure generally relates to the field of electronics, and more particularly, to radio frequency front-end modules.

Description of Related Technology

Radio frequency (RF) is a common term for a range of frequency of electromagnetic radiation typically used to produce and detect radio waves. Such a range can be from about 30 kHz to 300 GHz. Wireless communication devices often include front-end circuitry for processing or conditioning RF signals at an incoming or outgoing frequency or signal port. RF front-end modules may be components of receiver, transmitter, or transceiver systems associated with a wireless device.

RF front-end design may include a number of considerations, including complexity, substrate compatibility, performance, and integration. It can be desirable for wireless devices to support multiple wireless technologies. For instance, modern mobile phones and other wireless devices send and receive growing quantities of electronic data including email, electronic documents, data communicated during web browsing sessions, and the like, often by incorporating a wide area network (WLAN) interface. Modern devices often also support wireless connection to other electronic devices that are local to the user, including wireless headsets, ear pieces, watches, and other so called "wearable" devices. For instance, some wireless devices support Bluetooth communication, and can connect to Bluetooth capable wearable devices, or other Blue-tooth capable devices in proximity to the wireless device.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a multi-mode radiofrequency (RF) module that includes a semiconductor die and a power amplifier. The power amplifier is implemented on the die and configured to operate in a first RF mode and a second RF mode. The first RF mode corresponds to a first RF wireless technology standard, and the second RF mode corresponds to a second RF wireless technology standard. In the first RF mode a first set of circuitry is active within the power amplifier, and in the second RF mode a second set of circuitry is active within the power amplifier.

The power amplifier can include a dynamically configurable output stage circuit including a first output periphery that is active in the first RF mode and a second output periphery that is active in the second RF mode. The first output periphery can include a first output of the power amplifier, and the second output periphery can include a second output of the power amplifier. The first output periphery can include a first cascode circuit element, and the second output periphery can include a second cascode circuit element.

Additionally, the first cascode circuit element can include a first cascode bipolar transistor, and the second cascode circuit element can include a second cascode bipolar transistor. The first cascode bipolar transistor can be configured to selectively provide an amplified RF output signal to the first output of the power amplifier, and the second cascode bipolar transistor can be configured to selectively provide an amplified RF output signal to a second output of the power amplifier. The first cascode bipolar transistor and the second bipolar transistor can each arranged as a common base amplifier.

The dynamically configurable output stage can be dynamically configured to activate the first output periphery or the second output periphery in response to a control signal indicative of the first RF mode or the second RF mode.

The first RF wireless technology standard can be a Bluetooth standard, and the second RF wireless technology standard can be a WiFi standard.

The multi-mode RF module can include a switch. The switch can have first and second RF inputs, a switch control input, and an RF output. The switch can be configured to respond to an RF mode control signal received on the switch control input to selectively couple one of the first and second RF inputs of the switch to the RF output of the switch. The RF output of the switch can be coupled to an RF input of the power amplifier.

The multi-mode RF module can include an antenna switching module having a first RF transmit input port, a second RF transmit input port, and an antenna port. The first RF transmit input port can be coupled to an output of the power amplifier. The second RF transmit input port can be coupled to an RF transmit signal for a third RF mode corresponding to a third RF wireless technology standard. The antenna switch module can be configured to selectively couple one of the first RF transmit input port or the second RF transmit input port to the antenna port. The RF transmit signal provided on a port of the multi-mode module can have a significantly different maximum power output when the multi-mode module is operating in each of the first, second, and third RF modes.

The multi-mode RF module can include an RF receive path. The RF receive path can include a receive path amplifier, and the RF receive path can be configured to operate in either of a first receive mode and a second receive mode. In the first receive mode a receive signal output by the receive path is amplified by the receive path amplifier. In the second receive mode the receive signal output by the receive path is not amplified by the receive path amplifier. The receive path amplifier can be a low noise amplifier (LNA). The circuitry in the RF receive path can determine whether to operate in the first receive mode or the second receive mode based at least in part on an RF receive signal strength.

The multi-mode RF module can include dynamically configurable impedance matching circuitry configured to adjust an output impedance of the power amplifier based on the current RF mode of the multi-mode RF module.

The multi-mode module can be incorporated on a mobile phone capable of supporting at least a third RF mode corresponding to a third wireless technology standard. The third wireless technology standard can be a Long-Term Evolution (LTE) standard.

Another aspect of this disclosure is a wireless device including a multi-mode RF module and an antenna. The multi-mode RF module includes a semiconductor die and a power amplifier implemented on the die. The power amplifier is configured to operate in a first RF mode and a second RF mode. The first RF mode corresponds to a first RF wireless technology standard, and the second RF mode corresponds to a second RF wireless technology standard. The antenna is configured to wirelessly transmit a signal derived from an RF output of the multi-mode module.

Another aspect of this disclosure is a method of operating a wireless device. The method includes operating a power amplifier implemented on a semiconductor die of a multi-mode RF module in a first RF mode corresponding to a first RF wireless technology standard such that a first set of circuitry within the power amplifier is active. The method also includes switching the operational mode of the power amplifier from operating in the first RF mode to operating in a second RF mode corresponding to a second RF wireless technology standard in response to a change in the RF mode of the wireless device, Another aspect of this disclosure is a multi-mode radio frequency (RF) front end module (FEM). The RF FEM is configured to selectively operate in a first RF mode, a second RF mode, or a third RF mode; and the RF FEM includes an RF power amplifier, an antenna port, and an input switch. The RF power amplifier is configured to selectively operate in a low power mode or a high power mode. The input switch is configured to receive a first RF transmit signal and a second RF transmit signal. Additionally, the input switch is configured to: (i) couple the first RF transmit signal to the antenna port when the RF FEM is in the first RF mode; (ii) couple the first RF transmit signal to an input of the power amplifier when the RF FEM is in the second RF mode such that the power amplifier amplifies the first RF transmit signal to provide a first amplified RF transmit signal which is coupled to the antenna port; and (iii) couple the second RF transmit signal to the input of the power amplifier when the RF FEM is in the third RF mode such that the power amplifier amplifies the second RF transmit signal to provide a second amplified transmit signal which is coupled to the antenna port, the RF power amplifier being configured in the low power mode to provide a first power gain and in the high power mode to provide a second power gain greater than the first power gain.

The multi-mode RF FEM of claim 22 can further include a low noise amplifier (LNA) and a bypass switch. The LNA can be in a receive path of the RF FEM and have an input and an output. The input of the LNA can be coupled to the antenna port. The bypass switch can be coupled between the input and the output of the LNA. In a first receive mode of the RF FEM, the LNA can be configured to amplify an RF receive signal received from the antenna port and to provide an amplified RF receive signal at the output of the LNA. Also, in the first receive mode the bypass switch can be configured to operate as an open circuit in the first receive mode. In the second receive mode the bypass switch can be configured to operate as a short circuit.

The power amplifier can include a first transistor, a second transistor, and a bias control module. The first transistor can have an inverting terminal coupled to the antenna port, a following terminal, and a control terminal; and the second transistor can have an inverting terminal coupled to the antenna port, a following terminal, and a control terminal.

The bias control module can be configured to provide a first bias control signal to the control terminal of the first transistor and a second bias control signal to the control terminal of the second transistor. In the high power mode, the first bias control signal can control the first transistor to operate in an on state, and the second bias control signal can control the second transistor to operate in an on state. In the low power mode, the first bias control signal can control the first transistor to operate in an off state.

The first and second transistors can be bipolar junction transistors (BJTs). The inverting terminal of the first transistor can be a collector, and the inverting terminal of the second transistor can be a collector. Additionally, the control terminal of the first transistor can be a base, and the control terminal of the second transistor can be a base.

The multi-mode RF FEM can be part of a monolithic integrated circuit.

The multi-mode RF FEM can also include an antenna switching circuit. In the first RF mode the antenna switching circuit can indirectly couple the first RF transmit signal to the antenna port. In the second RF mode the antenna switching circuit can indirectly couple the first amplified RF transmit signal to the antenna port. In the third RF mode the antenna switching circuit can indirectly couple the second amplified transmit signal to the antenna port.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
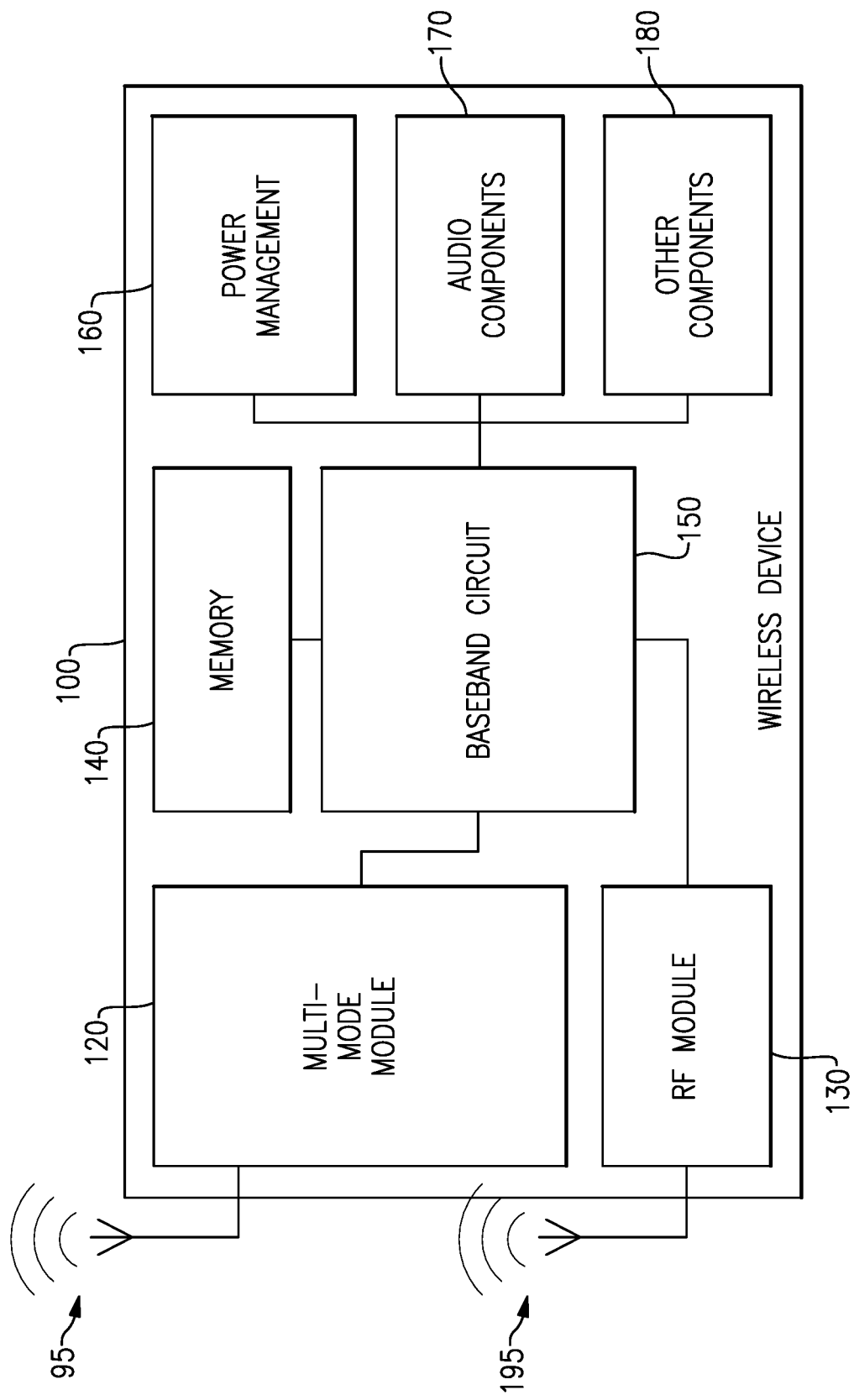
FIG. 1 is a block diagram showing an embodiment of a wireless device incorporating a multi-mode front-end integrated circuit (FEIC).

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Disclosed herein are example configurations and embodiments relating to a RF front end architecture providing multiple modes of wireless operation. For instance, integrated RF front-end modules (FEMs) are disclosed herein, which can be implemented as front-end integrated circuits (FEICs). These include fully-integrated FEMs capable of multiple modes of operation, where each mode corresponds to a different wireless technology.

The FEM can support at least two different modes of operation. For instance, according to certain aspects the FEM supports at least WiFi (e.g., compliant with one or more of the IEEE 802.11 family of standards) and Bluetooth modes of operation, where each mode of operation shares a common antenna and/or power amplifier. In certain embodiments, the FEM supports at least two different wireless technologies having operating frequencies in the 2.4 gigahertz (GHz) wireless band, or having operating frequencies of about 2.4 GHz or falling in a range of between about 2400 megahertz (MHz) and 2500 MHz.

According to certain aspects, a different RF transistor output stage periphery and/or corresponding load matching network are switched in, depending on the mode of operation. For instance, in a Bluetooth mode of operation, the FEM switches in a first output stage periphery and corresponding load matching network, and in a WiFi mode of operation, the FEM switches in a second output stage periphery and corresponding load matching network. In the Bluetooth mode of operation, the FEM can consume relatively lower power as compared to the WiFi mode of operation in accordance with the lower linearity requirements of Bluetooth as compared to WiFi.

Such FEMs can be particularly useful in enabling connection to wearable devices including wireless capable headsets, smart watches, smart glasses or eyewear, smart jewelry, and the like. For instance, FEMs described herein can be included in mobile phones or other mobile electronic devices configured to connect to such devices. FEMs described herein can also be incorporated into wearable devices themselves that are capable of supporting multiple different wireless technologies and corresponding modes of operation. As some additional non-limiting examples, RF FEM's described herein can be incorporated into computer network radios, cellular phones, PDAs, electronic gaming devices, security and monitoring systems, multi-media systems, and other electronic devices including wireless LAN (WLAN) radios.

The FEM can additionally support one or more cellular technologies, including Long Term Evolution (LTE), Global System for Mobile Communications (GSM), Wideband Code Division Multiple Access (WCDMA), and/or Enhanced Data Rates for GSM Evolution (EDGE).

Integrated FEMs or FEICs can simplify the RF design of radio front-end circuitry and reduce the layout complexity in a compact radio. For Systems incorporating multiple die inside a single FEM, assembly complexity, component area, cost, package height (e.g., due to die to die bonds within the FEM, depending on the types of bonds implemented), and overall yield may be important considerations. Therefore, it may be desirable to integrate some or all of the functional building blocks of an FEM into a single semiconductor die in a manner that addresses manufacturing cost, complexity, yield, component size, and reliability issues.

Integrating multiple functional building blocks of an FEM into one semiconductor die may introduce certain complications in that some aspect of the particular semiconductor technology used may be less than optimal for one or more particular blocks. For example, an FEM utilizing a gallium-arsenide (GaAs)-based platform (e.g., GaAs HBT), which may be well suited for RF power amplification, may not have satisfactory functional characteristics for integration of low-loss, high-isolation switches. In contrast, a controller for controlling, e.g., the functional position of a switch, or which among a group of amplifier devices are enabled, might preferably, or optimally, be done in a Silicon CMOS technology platform. Generally speaking, each technology platform may import certain advantages and/or disadvantages for each building block in a given module. Moreover, it may be challenging to even identify those aspects of the semiconductor technology platform that make it less than optimal to integrate a particular building block, or blocks.

SiGe BiCMOS technology is a semiconductor technology platform that may be used to provide a platform for complete functional integration of FEM components. For example, in certain embodiments, SiGe bipolar transistor and CMOS FET technologies may be incorporated together, along with possibly other types of circuit elements, such as capacitors, resistor, interconnect metallization, etc. U.S. Patent Application Publication No. 2014/0002187, filed on Jun. 28, 2012, titled "Integrated RF Front End System" (the '187 publication), and which is incorporated by reference herein in its entirety, provides embodiments of aspects of integrated FEMs that can be utilized in the FEMs described herein. In particular, any of the techniques for integrating the FEMs, FEICs, and other integrated devices shown and described in the '187 publication can be utilized in any of the integrated devices described in the present application.

FIG. 1 illustrates an embodiment of a wireless device 100 in accordance with one or more aspects of the present disclosure. Applications of the present disclosure are not limited to wireless devices and can be applied to any type of electronic device including RF front-end circuitry. For instance, according to some embodiments, the application of a high-resistivity substrate within the context of a SiGe BiCMOS process, such as is described in the '187 publication, may enable various types of circuits to be realized that will benefit from the reduction of device-substrate capacitance (e.g., cable line drivers, laser drivers, etc.) and reduced second-order modulation effects such as harmonics. For instance, implementation of GaAs BiCMOS technology on a SiGe high resistivity substrate can enable the integration of power amplifiers and high performance switches on a single die.

As shown, the illustrated wireless device 100 includes a multi-mode module 120 configured to support two or more modes of wireless operation. To such end, the multi-mode module 120 may be connected to one or more antennas 95. For example, the multi-mode 120 may include one or more power amplifier devices connected to the antenna(s) 95.

The multi-mode module 120 can support data communication in compliance with one or more communication protocols, such as WiFi (i.e., compliant with one or more of the IEEE 802.11 family of standards such as 802.11 b/g/n), Bluetooth, ZigBee. Supported Bluetooth protocols can include without limitation Bluetooth Class 1, Bluetooth Class 2, Bluetooth Class 3, Bluetooth v1.x, v2.x, v3.x, v4.x, Bluetooth Low Energy (BTLE or Bluetooth Smart), and any IEEE 802.15.1 compliant protocols. The multi-mode module 120 can support a variety of other protocols, such as any other protocol for connecting to wireless local area networks (WLANs) or wireless personal area networks (WPANs), and in some cases supports at least one WLAN technology (e.g., WiFi) and at least one WPAN technology (e.g., Bluetooth).

The multi-mode module 120 may include discrete components for amplification, filtering and/or other appropriate processing of signals in compliance with one or more of the supported wireless data transmission standards.

The multi-mode module 120 can form a part of an integrated FEM, for example, such as an integrated FEIC configured to support both a first mode of operation implementing a first wireless protocol and a second mode of operation implementing a second wireless protocol. In one such embodiment the multi-mode module 120 implements communicates using Bluetooth in the first mode and using WiFi the second mode of operation.

As will be discussed in further detail, the multi-mode module 120 can utilize a common antenna 95 for implementing at least two of the supported modes, such as where a common antenna 95 is used for both Bluetooth and WiFi modes.

In addition, the multi-mode module 120 can be configured to utilize a different RF transistor output stage periphery and/or corresponding load matching network depending on the mode of operation. For instance, in a first mode of operation, the multi-mode module 120 utilizes in a first output stage periphery and corresponding load matching network, and in a second mode of operation, the multi-mode module 120 in a second output stage periphery and corresponding load matching network. In this manner, the multi-mode module 120 can achieve efficient power consumption.

Other types of wireless protocols can be supported by the multi-mode module 120, including one or more of GSM, WCDMA, LTE, EDGE, or the like.

The wireless device 100 can include an additional wireless module, such as the RF module 130. The RF module 130 may include discrete components for amplification and/or filtering of signals in compliance with one or more wireless data transmission standards, including those used for cellular telephone communication. Standards supported by the RF module 130 can include one or more of GSM, WCDMA, LTE, EDGE, etc.

In one embodiment, the multi-mode module 120 supports Bluetooth and WiFi modes of operation, while the RF module 130 supports LTE. In another implementation, only the multi-mode module 120 is provided, and the RF module 130 is omitted.

The multi-mode module 120 and/or RF module 130 can include transceiver circuitry. In certain embodiments, multi-mode module 120 and/or RF module 130 comprise a plurality of transceiver circuits, such as to accommodate operation with respect to signals conforming to one or more supported wireless data communication standards. For instance, the multi-mode module 120 include one or more of a WiFi chip set, a Bluetooth chipset, an integrated WiFi/Bluetooth chipset. The RF module 130 can include an LTE chipset as one example. Transceiver circuitry may serve as a signal source that determines or sets a mode of operation of one or more components of the multi-mode module 120 and/or RF module 130.

Alternatively, or in addition, a baseband circuit 150, or one or more other components that are capable of providing one or more signals to the multi-mode module 120 and/or RF module 130 may serve as a signal source provided to the multi-mode module 120 and/or RF module 130. In certain embodiments, multi-mode module 120 and/or RF module 130 can include a digital to analog convertor (DAC), a user interface processor, and/or an analog to digital convertor (ADC), among possibly other things.

The multi-mode module 120 and/or RF module 130 of the illustrated embodiment are coupled to a baseband circuit 150, which can process radio functions associated with signals received and/or transmitted by one or more antennas (e.g., 95, 195), and generally provide a network interface for the multi-mode module and/or the RF module 130. Such functions may include, for example, signal modulation, encoding, radio frequency shifting, or other function. The baseband circuit 150 may operate in conjunction with a real-time operating system in order to accommodate timing dependant functionality. In certain embodiments, the baseband circuit 150 includes, or is connected to, a central processor. For example, the baseband circuit 150 and central processor may be combined (e.g., part of a single integrated circuit), or may be separate modules or devices.

The baseband circuit 150 is connected, either directly or indirectly, to a memory module 140, which contains one or more volatile and/or non-volatile memory/data storage, devices or media. Examples of types of storage devices that may be included in the memory module 140 include Flash memory, such as NAND Flash, DDR SDRAM, Mobile DDR SRAM, or any other suitable type of memory, including magnetic media, such as a hard disk drive. Furthermore, the amount of storage included in memory module 140 may vary based on one or more conditions, factors, or design preferences. For example, memory module 140 may contain approximately 256 MB, or any other suitable amount, such as 1, 8, 16, 32, 64, or 128 GB or more. The amount of memory included in wireless device 100 may depend on factors such as, for example, cost, physical space allocation, processing speed, etc.

In another embodiment, the baseband circuit 150 manages radio functions for only the RF module 130, and a separate network interface processor or other component manages radio functions for the multi-mode module 120.

The wireless device 100 includes a power management module 160. The power management module 160 includes, among possibly other things, a battery or other power source. For example, power management module 160 may include one or more lithium-ion batteries. In addition, the power management module 160 may include a controller module for management of power flow from the power source to one or more regions of the wireless device 100. Although the power management module 160 may be described herein as including a power source in addition to a power management controller, the terms "power source" and "power management," as used herein, may refer to either power provision, power management, or both, or any other power-related device or functionality.

The wireless device 100 may include one or more audio components 170. Example components may include one or more speakers, earpieces, headset jacks, and/or other audio components. Furthermore, the audio component module 170 may include audio compression and/or decompression circuitry (i.e., "codec"). An audio codec may be included for encoding signals for transmission, storage or encryption, or for decoding for playback or editing, among possibly other things.

The wireless device 100 includes one or more additional components 180. Examples of such components may include a display, such as an LCD display. The display may be a touchscreen display. Furthermore, the wireless device 100 may include a display controller, which may be separate from, or integrated with, the baseband circuit 150 and/or a separate central processor. Other example components that may be included in the wireless device 100 may include one or more cameras (e.g., cameras having 2 megapixel (MP), 3.2, MP, 5 MP, or higher resolutions), compasses, accelerometers, or other functional devices.

Figure 2A:
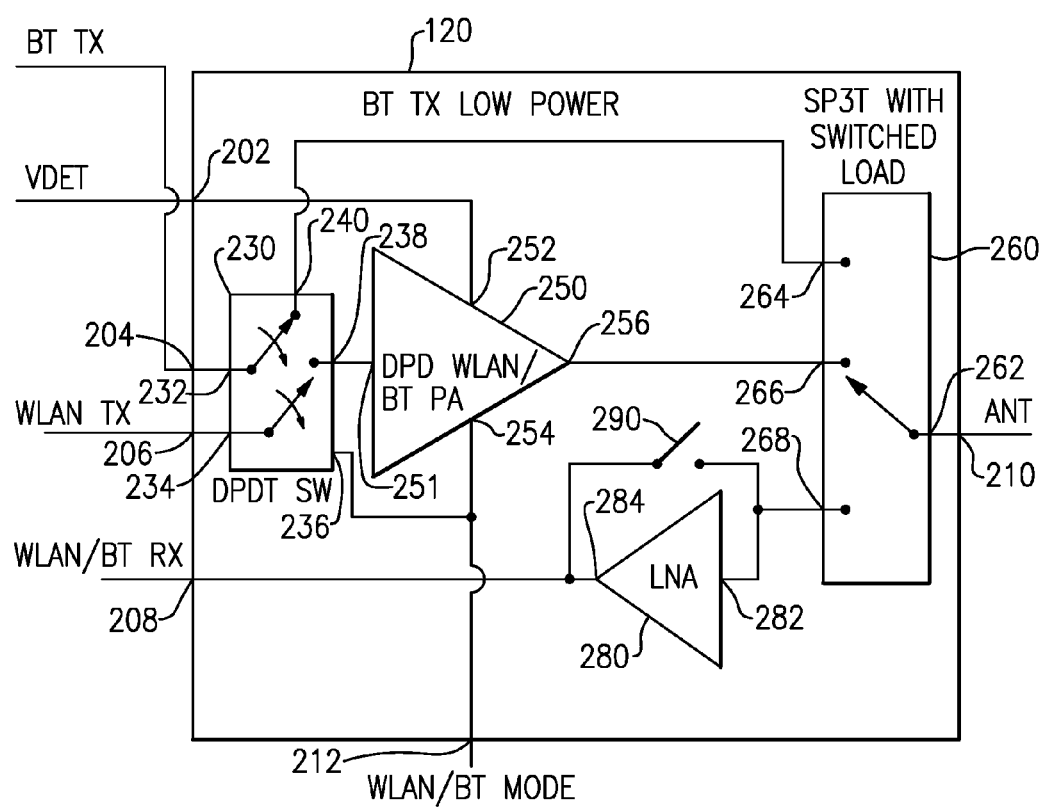
FIG. 2A illustrates embodiment of a multi-mode FEIC.

FIG. 2A shows an example of a multi-mode module 120, which can be or form a part of an integrated FEM, such as an FEIC. The illustrated multi-mode module 120 is capable of operating in a WLAN mode (e.g., a WiFi mode), and two different Bluetooth modes—a low power Bluetooth mode (e.g., BTLE), and a standard Bluetooth mode (e.g., Bluetooth Class 1 or Bluetooth Class 2).

As shown, the multi-mode module 120 includes an input switch 230, a power amplifier 250, an antenna switch module 260, and a low noise amplifier (LNA) 280. While these components are shown for simplicity, it will be appreciated that in some cases additional components can be included in the multi-mode module 120.

The multi-mode module 120 additionally includes a supply input port 202, a first transmit signal input port 204, a second transmit signal input port 206, a receive signal output port 208, an antenna port 210, and a wireless mode port 212.

The transmit signals (e.g., BT TX, WLAN TX) received on the input ports 202, 204 may be provided by one or more transceivers or other component(s) of the wireless device 100.

The supply signal (e.g., VDET) received on the supply input 202 may be provided by a battery or other power supply included on wireless device 120, or by a power signal derived from a supply signal, such as an envelope tracking signal, for example.

The receive signal output terminal 208 may be connected to one or more transceivers of the wireless device 100, which are configured to process the receive signal as appropriate.

The wireless mode port 212 can receive a mode signal (e.g., WLAN/BT mode) indicating which wireless operating mode the wireless device 100 is currently in (e.g., BTLE, another Bluetooth mode, or WiFi).

The antenna port 210 can be a bi-directional port coupled to an antenna of the wireless device 100. The antenna port 210 can generally communicate a wirelessly signal detected by an antenna to the multi-mode module 120 when the multi-mode module 120 is in a receive mode and to forward a transmit signal from the multi-mode module 120 to the antenna for wireless transmission when the multi-mode module is in a transmit mode.

While only the ports 202, 204, 206, 208, 210, 212 are shown in the illustrated embodiment for the purpose of simplicity, it will be appreciated that the multi-mode module 120 can include a number of additional ports, including ports to receive additional supply signals, such as to power the switch module 260, LNA 290, and/or other componentry, additional transmit and/or receive ports, or additional antenna ports, etc.

The input switch 230 has a first input terminal 232 that receives a Bluetooth transmit signal, and a second input terminal 234 that receives a WLAN (e.g., WiFi) transmit signal. For instance, the transmit signals can be generated by the baseband circuit 150. The switch 230 in the illustrated embodiment is a double pole, double throw (DPDT) switch, although other types of switches can be used. The input switch 230 has a control input 236, where the value of the control input determines the operation of the input switch 230.

The control input 236 in the illustrated embodiment may be a two-bit digital input that can specify one of the three possible operating modes: low power Bluetooth, standard Bluetooth, or WLAN. If the value on the control input 236 specifies a WLAN mode, the input switch 230 connects the second input terminal 234 to a first output terminal 238 of the switch 230, thereby directing the WLAN transmit signal (WLAN TX) received on the second transmit signal input port 204 of the multi-mode module 120 to the first output terminal 238. If, on the other hand, the value on the control input 236 indicates that the wireless device 100 is in a standard Bluetooth mode, the input switch 230 connects the first input terminal 232 to the first output terminal 238, thereby directing the Bluetooth transmit signal (BT TX) received on the first transmit signal input port 204 of the multi-mode module 120 to the first output terminal 238. If the value on the control input 236 indicates that the wireless device is in a low power Bluetooth mode, the input switch 230 connects the first input terminal 232 to a second output terminal 240 of the input switch 230, thereby directing the Bluetooth transmit signal (BT TX) to the second output terminal 240 of the input switch 230.

The signal provided on the first output terminal 238 of the input switch 238 is provided to a power amplifier 250. The power amplifier 250 can include a number of transistors and other circuitry. The power amplifier 250 can include multiple paths, which may correspond to or include different output peripheries. For instance, the power amplifier 250 can include a first path including circuitry that is active or used when the power amplifier 250 is in a first operational mode, and a second path including circuitry that is active or used when the power amplifier is in a second operational mode. In the illustrated embodiment, the power amplifier is capable of operating in at least two modes including a Bluetooth mode (e.g., Bluetooth Class 1) and a WLAN mode (e.g., WiFi).

The power amplifier 250 includes an input terminal 251 configured to receive the signal provided on the first output terminal 238 of switch 230, a supply terminal 252 configured to receive a supply signal that powers the circuitry within the power amplifier 250, a control input 254 that controls operation of the power amplifier 250, and an output terminal 256 configured to provide an amplified version of the signal received at the input terminal 251.

In the illustrated embodiment, the supply input 252 receives an envelope tracking power supply input (VDET), which may be generated by the power management module 160, although a variety of techniques can be used to power the power amplifier, such as an average power tracking (APT).

The power amplifier 250 can be configured to implement digital pre-distortion (DPD) in certain embodiments in order to improve linearity.

The control input 254 of the illustrated embodiment receives the operational mode signal (WLAN/BT Mode) indicating the current operational mode of the wireless device 100. For instance, as discussed, the operational mode signal can be a two bit signal specifying one of a low power Bluetooth (BTLE), standard Bluetooth, or WLAN operational mode. When the signal received at the control input 254 specifies a standard Bluetooth mode, the power amplifier 250 can switch in circuitry corresponding to a first output circuitry path within the power amplifier 250 designed to amplify and/or otherwise process the signal received at the input terminal 251 as appropriate for Bluetooth communication. When the signal received at the control input 254 specifies WLAN mode, the power amplifier 250 can switch in circuitry corresponding to a second output circuitry path within the power amplifier 250 designed to amplify and/or otherwise process the input signal received at the input terminal 251 as appropriate for WLAN (e.g., WiFi) communication. For instance, the second circuitry path may be designed to generate a relatively higher power output signal according to the WLAN standard, while the first circuitry path may be designed to generate a lower power output signal that meets the Bluetooth standard, and that also consumes less power than the second circuitry path, thereby saving power in the standard Bluetooth mode. In the low power Bluetooth mode, the power amplifier 250 of the illustrated embodiment is bypassed as will be described, and the power amplifier 250 can operate in a low power mode. For instance, when the signal received at the control input 254 specifies a low power Bluetooth mode, the first circuitry path may be activated, or both the first and second circuitry paths may be deactivated.

The switch module 260 can facilitate switching between receive and transmit paths, and can be configured to electrically connect an antenna to a selected transmit or receive path via an antenna terminal 262. Thus, the switch module 260 can provide a number of switching functionalities associated with an operation of the wireless device 100. In certain embodiments, the switch module 260 can include a number of switches configured to provide functionalities associated with, for example, switching between different bands, switching between different power modes, switching between transmission and receiving modes, or any combination thereof. The switch module 260 can also be configured to provide additional functionality, including filtering and/or duplexing of signals.

The switch module 260 can include a control input (not shown) configured to receive a signal that implements various control functionalities associated with operations of the switch module 260. For instance, in some embodiments the control input can receive a control signal generated by a processor or other component residing on the wireless device 100 but external to the multi-module module 120, such as on a different die than the multi-module module 120. In other embodiments, the control signal is generated by a device that resides on the multi-mode module 120.

The switch module 260 of the illustrated embodiment additionally includes first and second input terminals 264, 266. The first input terminal 264 is electrically coupled to the second output terminal 240 of the input switch 230, and thus receives the Bluetooth low power transmit signal when the wireless device 100 is operating in a BTLE mode, for example. The second input terminal 266 is electrically coupled to the output terminal 256 of the power amplifier 250, and thus receives either an amplified version of the standard Bluetooth transmit signal, or an amplified version of the WLAN transmit signal, depending on the current operating mode of the wireless device 100.

When the wireless device 100 is in a low power Bluetooth transmit mode, the illustrated switch module 260 connects the first input terminal 264 to the antenna terminal 262 such that the low power Bluetooth transmit signal is provided to the antenna for wireless transmission. When the wireless device 100 is in either of the standard Bluetooth transmit mode or the WLAN transmit mode, on the other hand, the illustrated switch module 260 connects the second input terminal 266 to the antenna terminal 262 such that the output of the power amplifier 250 is provided to the antenna for wireless transmission.

The switch module 260 further includes a receive terminal 268. When the wireless device is in a receive mode (e.g., a BTLE, WLAN, or standard Bluetooth receive mode), the illustrated switch module 260 connects the antenna terminal to the receive terminal 268, such that a signal wirelessly received on the antenna is forwarded to the receive terminal 268.

The switch module 260 can include a number of switches and appropriate circuitry to implement the described switch functionality. While a single pole, triple throw switch is shown for the purposes of illustration, a variety of configurations are possible.

The LNA 280 can be included in the RX path(s) between the switch module 260 and one or more transceivers or other components, which may be located in a baseband circuit 250, for example. The LNA 280 can be configured to amplify and otherwise condition the signal(s) received from the switch module 280 at an input terminal 282 of the LNA 280, to provide an amplified/conditioned output signal on an output terminal 284 of the LNA 280. It may be beneficial to bypass the LNA 280 in certain cases, such as to provide higher dynamic range for near field signals such as Bluetooth and WiFi. A bypass switch 290 can be included to provide the bypass functionality. For instance, the illustrated bypass switch 290 is a single pole, single throw switch coupled to the receive terminal 268 of the switch module 260 and the output terminal 284 of the LNA 280. The bypass switch 290 may be opened and closed to selectively bypass the LNA 280 based on the operational mode (e.g., closed in Bluetooth mode, open in WiFi mode), or can be opened and closed based on other conditions. For instance, in one embodiment, the wireless device performs a signal strength measurement on the signal present at the receive terminal 268 of the switch module 260, and the wireless device opens and closes the bypass switch 290 depending on the receive strength. For instance, when the detected receive strength is relatively low, the bypass switch 290 is opened, and the LNA 280 is used to amplify/process the signal and improve the signal strength, whereas when the detected receive strength is relatively higher, the bypass switch 290 is closed, bypassing the LNA 280. Other configurations are possible to achieve the bypass functionality. In one such implementation, the LNA 280 supports a bypass mode, and includes internal circuitry to achieve the bypass function, rather than through the use of a bypass switch 290 external to the LNA 280. In another embodiment, an additional switch is provided in addition to the switch 290, at the input of the LNA 282. The additional switch can be open in the LNA bypass mode, thereby decoupling the LNA from the receive path, and closed when not in the LNA bypass mode.

The control input for the bypass switch 290 (not shown) can be generated by a processor or other component residing on the wireless device 100 but external to the multi-mode module 120, such as on a different die than the multi-module module 120. In other embodiments, the control signal is generated by a device that resides on the multi-mode module 120.

Regardless of whether the LNA 280 is bypassed or not, the receive signal is forwarded off of the multi-module module 120 via the receive signal output port 208.

Figure 2B:
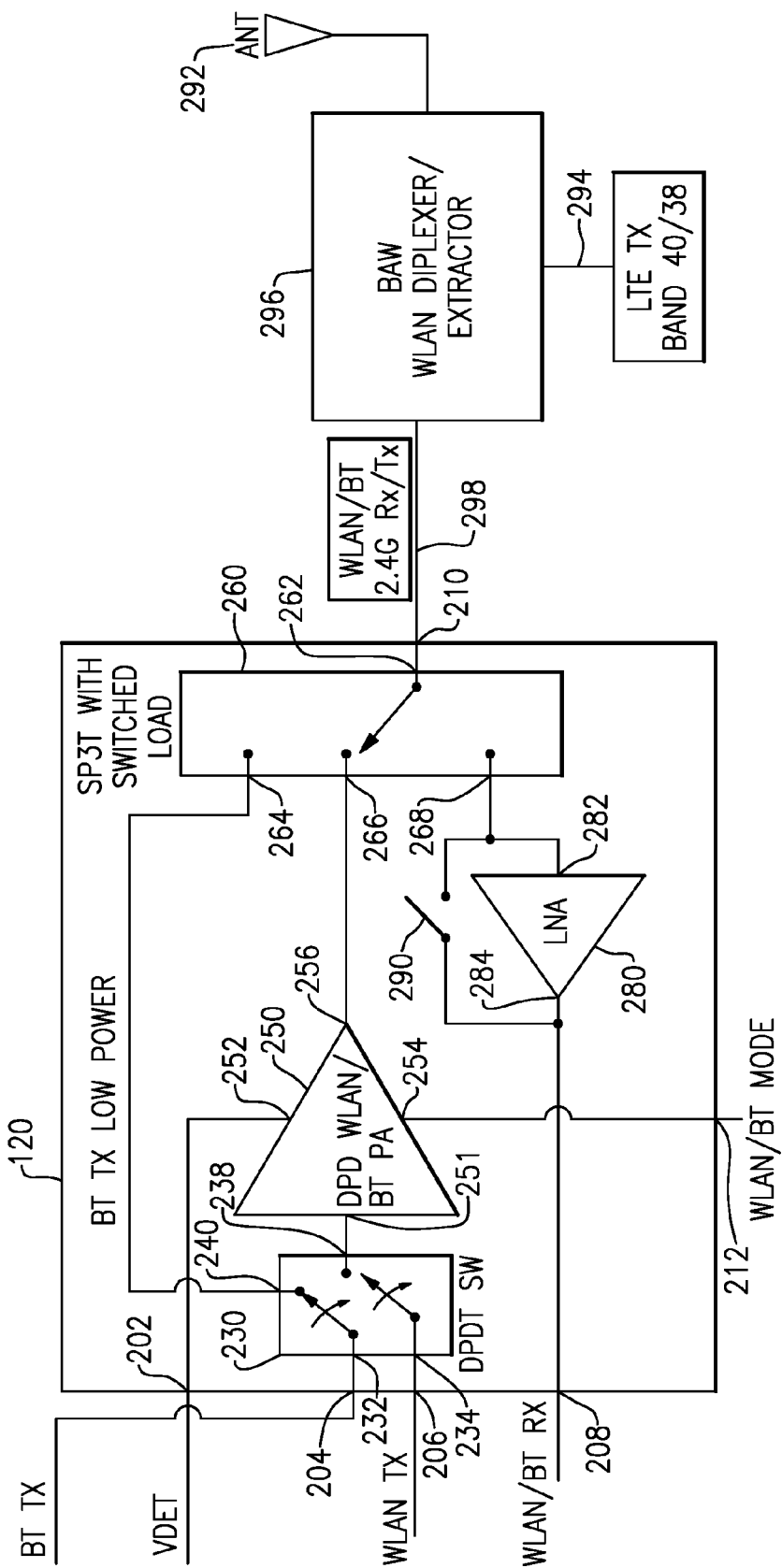
FIG. 2B illustrates a multi-mode FEIC connected to a diplexer to support a cellular mode of operation according to certain embodiments.

FIG. 2B shows an embodiment of a multi-mode module 120 where the multi-mode module 120 shares a common antenna 292 with a transmit portion of an LTE path supported by the wireless device 100. For instance, referring to FIG. 1, the wireless device 100 may include the multi-mode module 120 capable of transmitting and receiving 2.4 gigahertz (GHz) WiFi and Bluetooth, and an RF module 130 capable of supporting LTE communication, such as communication in LTE bands 40 and/or 38, or in some other LTE band. The RF module 130 may reside on a separate die than the multi-mode module 120, for example.

In the illustrated embodiment, a common antenna 292 is shared for transmitting and receiving RF signals using the multi-mode module, and for transmitting an LTE transmit signal 294. The wireless device 100 may include a separate antenna (not shown) for receiving LTE signals.

A bulk acoustic wave (BAW) diplexer/extractor 296 can act as a passive crossover network that allows for simulateneous transmission of the LTE transmit signal 294 and transmission/reception of the output signal 298 of the multi-mode module 120 (e.g., Bluetooth or WiFi signal).

Figure 3:
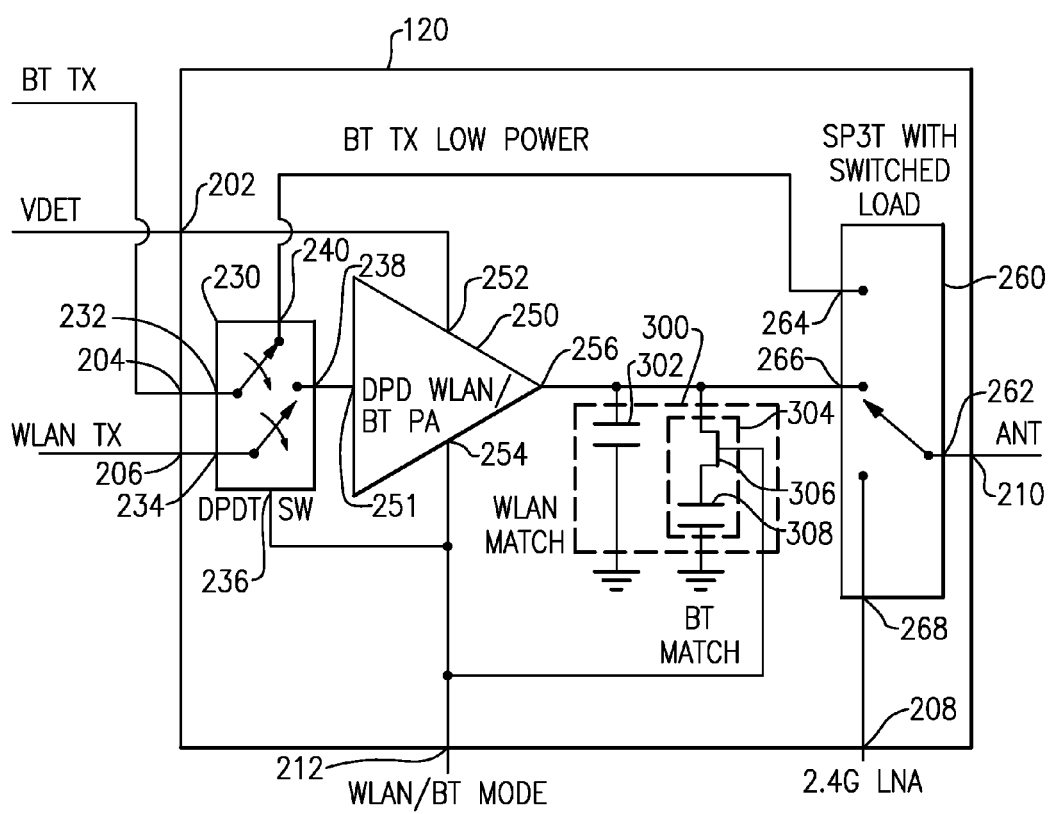
FIG. 3 illustrates another embodiment of a multi-mode FEIC.

FIG. 3 shows another embodiment of a multi-mode module 120. Unlike the the multi-mode module 120 of FIG. 2A, the multi-mode module 120 of FIG. 3 does not include an LNA, although the LNA could be included in another implementation. The LNA may reside on a different die than the multi-mode module 120, and be coupled to the receive signal output terminal 208, for example.

Also unlike the multi-mode module 120 of FIG. 2A, the multi-mode module 120 of FIG. 3 includes matching circuitry 300 providing configurable impedance matching functionality, so as to reduce reflection of the output signal from the power amplifier 250 back into the power amplifier 250. For instance, impedance matching circuitry 300 can be configured to adjust the impedance looking into the output of the power amplifier 250 to be about 50 ohms, so as to match a corresponding termination impedance of about 50 ohms. The termination impedance can be the impedance of an antenna tuning network or antenna matching network, for example, which can reside on the wireless device 100 externally to the multi-mode module 120, between the die on which the multi-mode module 120 resides and the antenna 95.

The illustrated matching circuitry 300 includes a first portion 302 and a second portion 304. The first portion 302 is represented as including a single capacitor in FIG. 3, and the second portion 304 is represented as including a single capacitor 308 and a switch 306, which may be a transistor-based switch. The control input to the switch 306 is coupled to the wireless mode port 212 of the multi-mode module 120, and receives an wireless operating mode signal.

When the power amplifier 250 is operating in a relatively lower power mode (e.g., a Bluetooth mode), achieving a desired output impedance (e.g., about 50 ohms) for the power amplifier 250 may involve inserting relatively more impedance compensation than when the power amplifier 250 is operating in a relatively higher power mode (e.g., a WiFi mode). Thus, in the illustrated embodiment, when the wireless operating mode signal coupled to the control input of the switch 306 indicates a standard Bluetooth mode, the switch 306 closes, and both the first and second portions 304, 306 of the matching circuitry 300 impact the output impedance of the power amplifier 250.

On the other hand, when the wireless device 100 is operating in a relatively higher power mode such as a WLAN (e.g., WiFi) mode, relatively less impedance compensation results in a desired output impedance (e.g., about 50 ohms) than in a lower power mode (e.g., a Bluetooth mode). Thus, when the operating mode signal indicates that the wireless device 100 is operating in a WLAN (e.g., WiFi) mode, the switch 306 is open, decoupling the second portion 304 of the matching circuitry 300 from the output of the power amplifier 250. In this scenario, the output impedance looking into the power amplifier 250 is adjusted by the first portion 302, but not the second portion 304.

While the impedance matching circuitry 300 is shown as external to the power amplifier 250, the matching circuitry 300 can form part of the power amplifier 250, and can be incorporated within the power amplifier 250.

In addition, while first portion 302 is represented as including a single capacitor in FIG. 3, and the second portion 304 is represented as including a single capacitor 308 and a switching 306, it will be appreciated that the impedance matching circuitry 300 can include more complex circuitry, including a network of capacitors, inductors, resistors, and the like, designed to provide the desired impedance compensation effect. Moreover, the illustrated embodiment includes a single switch 306, where only the second portion 304 can be selectively decoupled from the output of the power amplifier 250, and the first portion 302 is always affecting the output impedance of the power amplifier 250. In another embodiment, another switch is provided, and the first portion 302 can be selectively decoupled (switch open) from the output of the power amplifier 250, such as when the wireless device 100 is in a Bluetooth or other relatively lower power operating mode, and coupled to the output of the power amplifier 250 (switch closed) when the wireless device 100 is in a WLAN or other relatively higher power mode.

Figure 4:
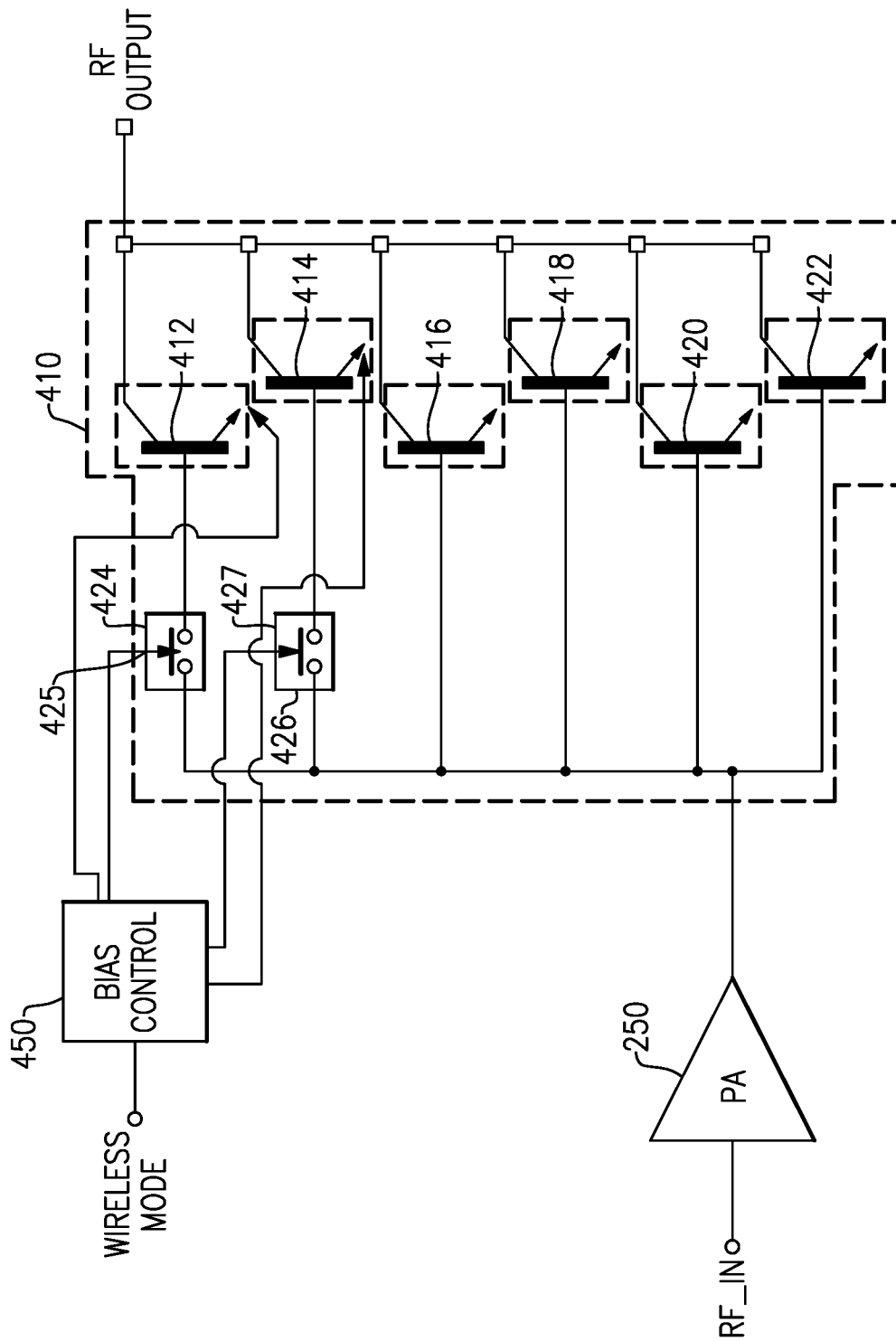
FIG. 4 illustrates an example of an output stage of a power amplifier of a multi-mode FEIC.

FIG. 4 shows an example of an output stage or output network 410 of a power amplifier 250 for use in a multi-mode module, such as the multi-mode modules 120 of any of FIGS. 1-3, for example. The output network 410 provides multiple different selectable output peripheries for the power amplifier 250, where the different peripheries can be activated or 'switched in' as appropriate, based on the wireless operating mode of the wireless device 100.

The output network 410 includes six transistors 412, 414, 418, 420, 422, which may be bipolar junction transistors (BJTs), although other types of transistors could be used.

While shown as being external to the power amplifier 250, the output network 410 can actually form a part of the power amplifier 250. The power amplifier 250 receives an RF input signal RF_IN, and provides an amplified signal. The output of the power amplifier 250 is coupled directly to the bases of the lower four transistors 416, 418, 420, 422, and is coupled to the bases of the upper two transistors 412, 414 through a pair of respective switches 424, 426, which may be transistor-based switches. In this way, the amplified signal from the power amplifier 250 can be provided to the bases of the transistors 416, 418, 420, 422, and switch coupled to the bases of the transistors 424 and 426. The control inputs 425, 427 of the switches 424, 426 are controlled by corresponding outputs of a bias control circuit 450, which are generated by the bias control circuit 450 in response to a wireless mode signal. Referring to FIG. 2A, the wireless mode signal can be the WLAN/BT Mode signal received at the port 212 of the multi-mode module 120.

In the illustrated configuration, the transistors 412, 414, 418, 420, 422 are configured as common emitter amplifiers whereby the output signal RF OUTPUT is coupled to the collectors, although other implementations are possible. For instance, a multi-transistor configuration can be used to replace each transistor 412, 414, 418, 420, and 422. One example of a multi-transistor configuration can include a common emitter stage coupled with a cascode stage. Another example of a multi-transistor configuration is a Darlington pair.

In one embodiment, the bias control circuit 450 generates outputs that cause the switches 425, 427 to open when the wireless device 100 is operating in a low power mode (e.g., standard Bluetooth mode), thereby decoupling the top two transistors 412, 414 from the output of the power amplifier 250. When decoupled, the top two transistors 412, 414 can be configured to operate in cutoff. In a high power mode (e.g., WLAN mode), the bias control circuit 450 generates outputs that cause the switches 425, 427 to close, such that the switches 425, 427 pass the output of the power amplifier 250 to the transistors 412, 414. Thus, in the low power mode, the bottom four transistors 416, 418, 420, 422 form a first output periphery for the power amplifier 250, while in the high power mode, all six of the transistors 412, 414, 416, 418, 420, 422 form a second output periphery for the power amplifier 250. Because only a subset of the transistors are active in the low power mode, power consumption associated with the output network 410 is reduced in the low power mode.

In this manner, a dynamically configurable output network 410 such as the one shown in FIG. 4 can improve the power efficiency of an integrated FEM that shares a common power amplifier 250 for supporting multiple wireless operating modes.

In some other embodiments, the bias control circuit 450 is not included on the multi-mode module 120, in which case the multi-mode module 120 may receive the signals for controlling the switches 424, 426 directly via input ports of the die on which the multi-mode module 120 resides.

Figure 5:
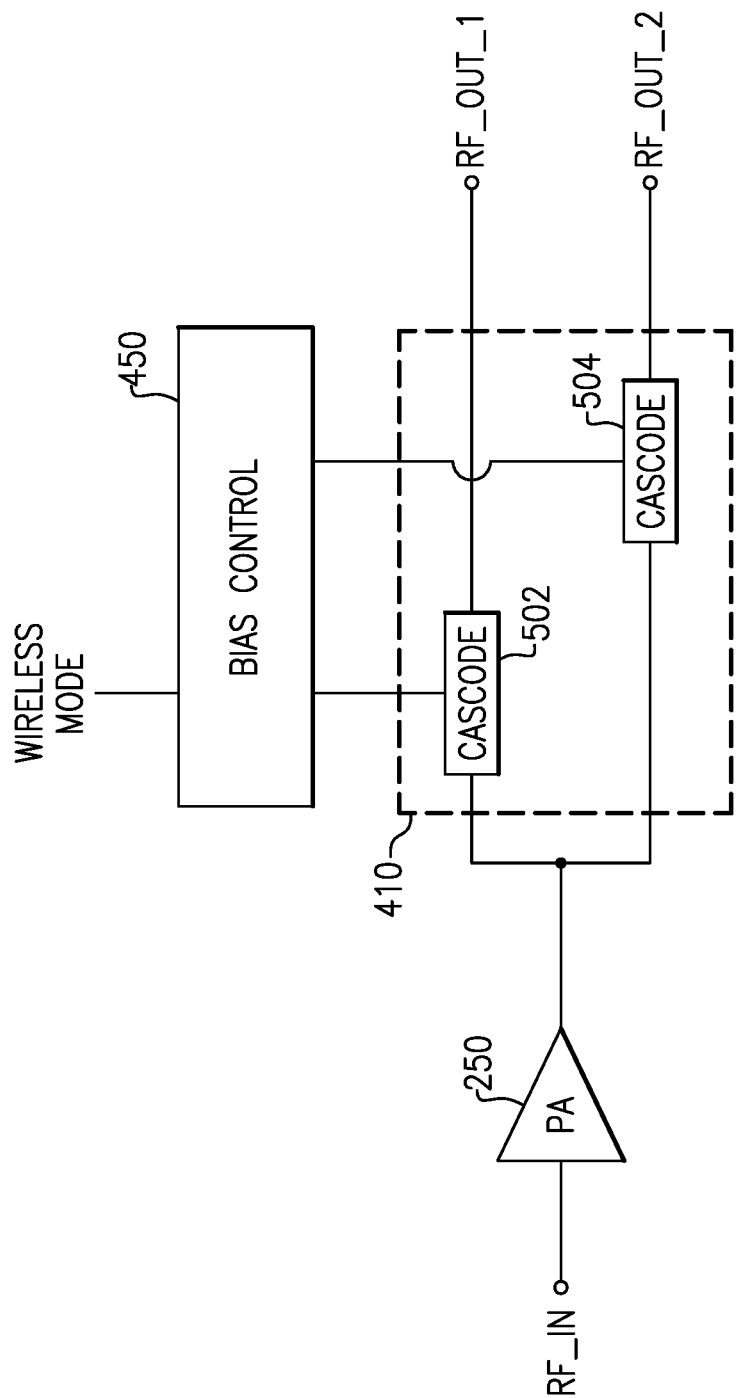
FIG. 5 illustrates an example of an output stage of a power amplifier of a multi-mode FEIC that includes cascode elements.

FIG. 5 shows another embodiment of a dynamically configurable output stage or output network 410 that incorporates cascode circuit elements 502, 504 to provide selectable output peripheries for the power amplifier 250. The cascode circuit elements 502, 504 can be a pair of cascode amplifiers formed from BJTs, for example.

Based on the wireless mode, the bias control 450 in some embodiments dynamically activates one of the cascode circuit elements 502, 504 and deactivates the other cascode circuit element 502, 504. For instance, the first cascode circuit element 502 may correspond to a low power mode (e.g., standard Bluetooth mode) in one embodiment, and the bias control 450 activates the first cascode circuit element 502 and deactivates the second cascode circuit element 504 in the low power mode. Conversely, in a high power mode (e.g., WLAN mode), the bias control 450 activates the second cascode circuit element 504 and deactivates the first cascode circuit element 502. While shown as separate circuits, the first and second cascode circuit elements 502, 504 can share one or more circuit elements in common. For instance, FIG. 10 described in greater detail below shows a detailed example of an output network 30 in which two output paths share a transistor 12 configured in a common emitter configuration.

One difference between the output network 410 shown in FIG. 5 and the output network 410 shown in FIG. 4 is that the output network 410 of FIG. 5 provides dynamically selectable, but separate output paths corresponding to each of the cascode circuit elements 502, 504, while the one shown in FIG. 4 provides a single output, portions of which can be deactivated, thereby providing different output peripheries with a single output. As shown in FIG. 5 the cascode element 502 can provide output signal RF_OUT_1 and the cascode element 504 can provide output signal RF_OUT_2.

Figure 6:
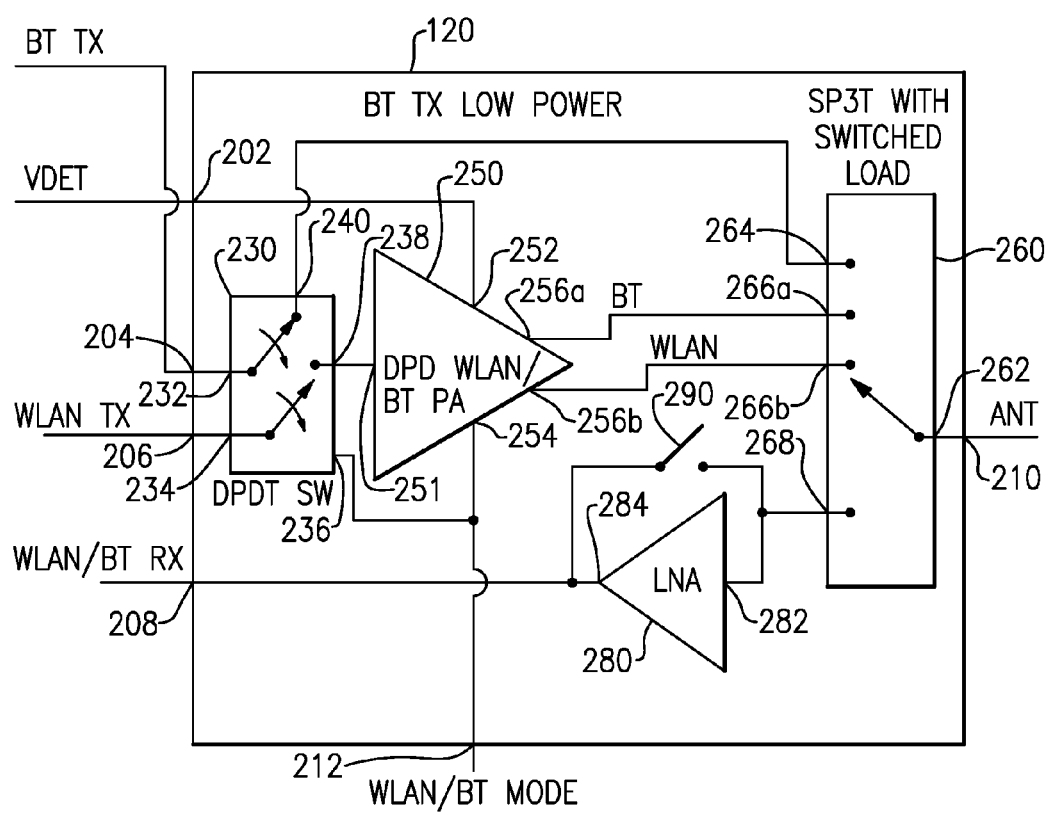
FIG. 6 illustrates an embodiment of a multi-mode FEIC including a power amplifier incorporating an output stage such as that of FIG. 5.

FIG. 6 shows an embodiment of a multi-mode module 120 having a power amplifier 250 that incorporates an output network 410 such as the one shown in FIG. 5. The power amplifier 250 has a first output terminal 256a corresponding to a first cascode circuit element 502 and corresponding output path of the output network 410, and a second output terminal 256b corresponding to a second cascode circuit element 504 and corresponding output path of the output network 410. As compared to the switching modules 260 of FIGS. 2 and 3, the switching module 260 of FIG. 4 includes an additional input port to accommodate the two outputs coming from the power amplifier 250. In particular, the switching module 260 includes a first input port 264 which receives the low power Bluetooth transmit signal from the input switch 230, a second input port 266a which receives a standard Bluetooth transmit signal from the power amplifier 250, and a third input port 266b which receives a WLAN transmit signal from the power amplifier 250. When the wireless device 100 is transmitting, the switching module 260 toggles between the three inputs 264, 266a, 266b as appropriate, depending on the wireless operating mode.

Additional implementations of output networks incorporating cascode elements are shown and described below with respect to FIGS. 9-14.

Figure 7A:
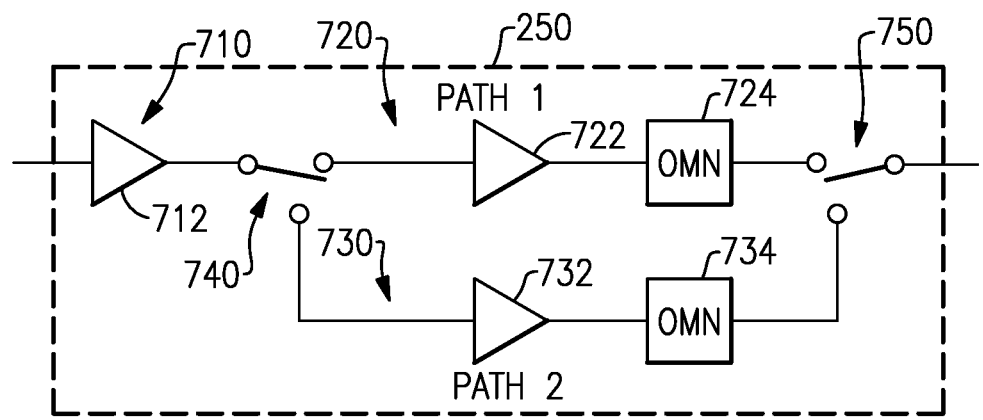
FIGS. 7A and 7B show embodiments of multi-stage power amplfiiers that can be incorporated into a multi-mode FEIC.
Figure 7B:
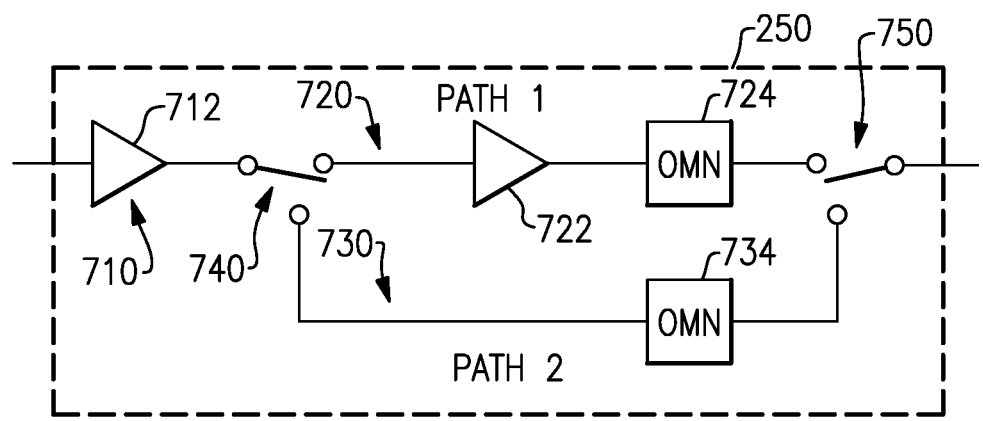

FIGS. 7A and 7B show embodiments of multi-stage power amplifiers 250 that can be incorporated into a multi-mode module, including any of the multi-mode modules 120 shown herein.

Referring to FIG. 7A, the power amplifier 250 includes a first amplifier stage 710 including a first amplifier 712, which may comprise one or more BJTs, for example (e.g., one or more GaAs HBTs). The first amplifier stage 710 amplifies a received RF signal, which can be an output signal 238 received from an input switch 230 of a multi-mode module 120.

The power amplifier 250 additionally includes a second output stage coupled to the output of the first amplifier stage 710 and including first and second paths 720, 730, where one of the paths is selectable via a first switch 740. Although other types of switches are possible, the first switch 740 can be a cascode switch, such as any of the cascode switches described herein (e.g., with respect to FIG. 5, 6, 9, 10, 11). The first switch 740 may be implemented using one or more SiGe bipolar transistors, for example.

The illustrated first and second paths 720, 730 respectively include second and third amplifiers 722, 732, which may comprise one or more GaAs HBTs, for example, as well as first and second output matching network 724, 734. The output matching networks 724, 734 can include a network of capacitors, inductors, resistors, and the like, for example, designed to provide a desired impedance compensation effect for the respective paths 720, 730.

In some embodiments it is desirable to keep the input power constant but maintain a different, e.g., lower output power on the second path 730 as compared to the first path 720. For instance, in some embodiments the first path 720 corresponds to a first wireless operating mode, such as a WLAN (e.g., WiFi) mode, and the second path 730 corresponds to a second wireless operating mode, such as a Bluetooth mode. In such a case, the second power amplifier 724 of the WLAN path 720 may be configured for relatively less power amplification than the third power amplifier 726 of the Bluetooth path 730. In some other such cases, it may be desirable not to include an amplifier on the second path 730, as is shown in FIG. 7B. This can reduce power consumption and/or cost.

The second stage of the power amplifier 250 can further include a second switch 750 which is controlled to selectively couple to the output of the power amplifier 250 whichever of the first and second paths 720, 730 are active, and therefore currently coupled to the output of the first power amplifier stage 710. For instance, the second switch 750 may be controlled using the same signal as the first switch 740. Such a control signal may be generated by any device residing on the wireless device 100, such as a control signal received by the multi-mode FEIC 120 and generated by a controller residing on the wireless device 100.

The second switch 750 can be a cascode switch, such as any of the cascode switches described herein (e.g., with respect to FIG. 5, 9, 10, 11). The switch 750 may be implemented using one or more SiGe bipolar transistors, for example.

According to certain embodiments, the power amplifiers 250 described herein including those shown in FIGS. 7A-7B can be implemented using GaAs BiCMOS technology on a SiGe or other high resistivity substrate. This can facilitate integration of amplifier componentry onto a single die with the high performance switches. For instance, referring to FIGS. 7A-7B, the amplifiers 712, 722, 732 and the switches 740, 750 can be implemented using GaAs BiCMOS technology on a SiGe high resistivity substrate. In addition to providing other benefits, this integration can enable bypassing of power amplifier stages, such as in the manner shown in FIGS. 7A-7B, without the use of more complex solutions involving the use of transmission lines and impedance inverters.

Moreover, where cascode elements are used, such as in implementation of the cascode elements 502, 504 of FIG. 5 and/or the switches 740, 750 of FIGS. 7A-7B, the cascode elements can be viewed as switches, and using such cascode elements can facilitate integration of the switches into the same die as the other components of the power amplifier 250. Cascode elements can also provide additional gain to one or more paths of the power amplifier 250 (e.g., the paths corresponding to the cascode elements 502, 504 of FIG. 5 and/or the paths 720, 730 of FIGS. 7A-7B). In some embodiments, the cascode elements can be partially switched, allowing for equal signal to each of multiple power amplifiers paths.

Figure 8:
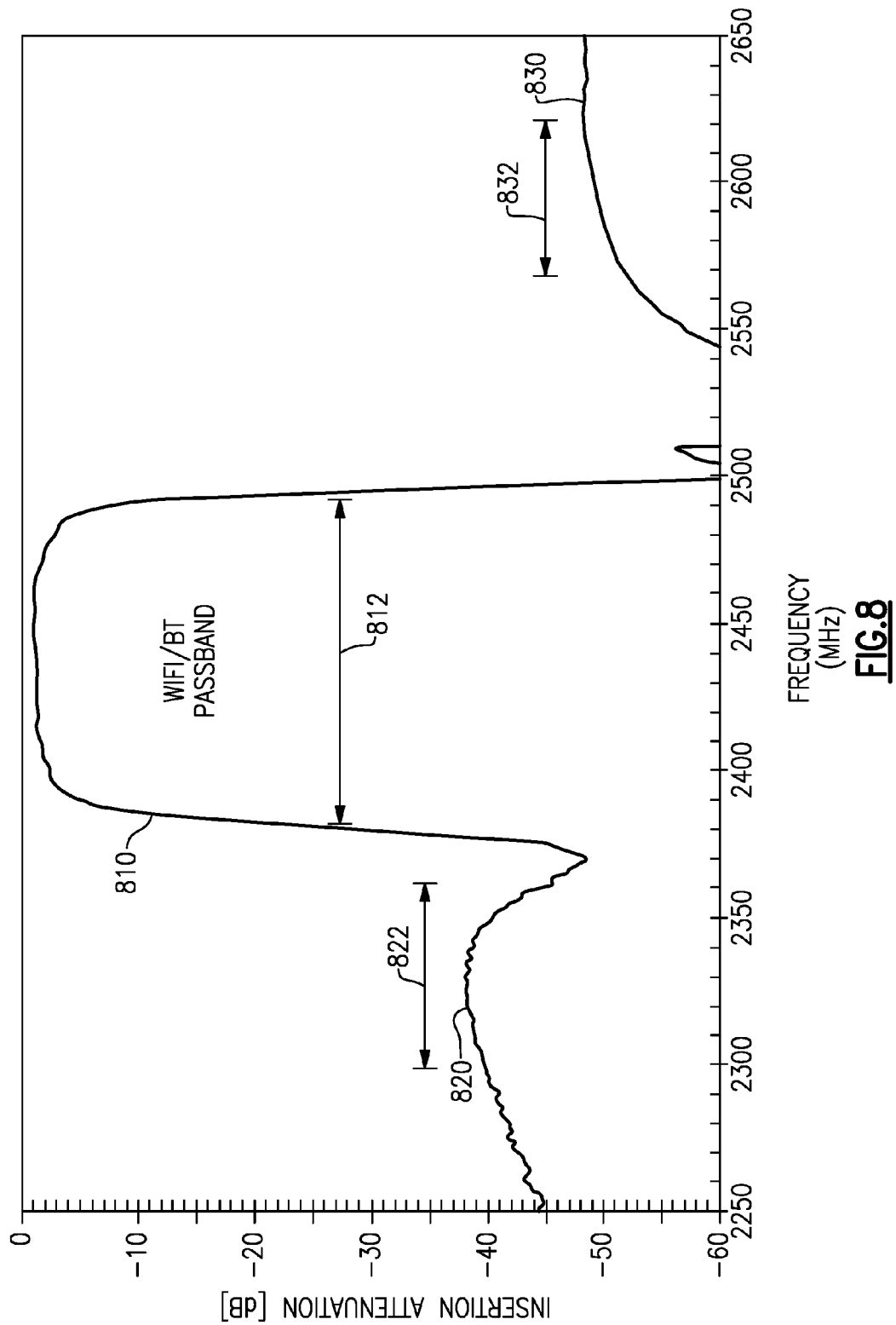
FIG. 8 is an example of a transfer function of the diplexer shown in FIG. 5.

FIG. 8 shows a transfer function of an example diplexer/extractor, such as the diplexer/extractor 296 shown in FIG. 2B. The transfer function includes a center lobe 810 corresponding to a WiFi/Bluetooth passband 812, spanning from about 2.375 GHz to 2.500 GHz. A left lobe 820 corresponds to an LTE band 40 passband 822, spanning from about 2.300 GHz to about 2.360 GHz, and a right lobe 830 corresponds to an LTE band 38 passband 832, spanning from about 2.570 GHz to about 2.620 GHz.

Embodiments of Cascode Circuits That Can Be Used in the Output Stage of a Power Amplifier in Multi-Mode FEMs As discussed above, such as with respect to FIGS. 5 and 6, the multi-mode FEMs described herein can incorporate output stages having cascode circuit elements. FIGS. 9-14 describe embodiments of power amplifier output stages or networks incorporating cascode circuit elements. Many of these embodiments are described in the context of multi-stage power amplifiers, where a first stage power amplifier incorporates the output network and the output network provides separate output paths feeding different second stage power amplifiers. For example, in certain embodiments, multi-stage power amplifiers can have cascode controllable cascode stages switching between two or more RF signal paths to enable a selected RF path corresponding to a particular mode of operation. U.S. patent application Ser. No. 14/965,633, filed on Dec. 10, 2015 titled "Cascode Switch For Power Amplifier," and which is incorporated by reference herein in its entirety, provides embodiments of aspects of integrated FEMs and switches and switch networks that can be utilized in the FEMs described herein. Also, it will be appreciated, however, that such output stages can be incorporated into the multi-mode FEMs described herein, such as is shown and described with respect to FIGS. 5 and 6, where the power amplifiers may or may not be multi-stage power amplifiers.

Figure 9:
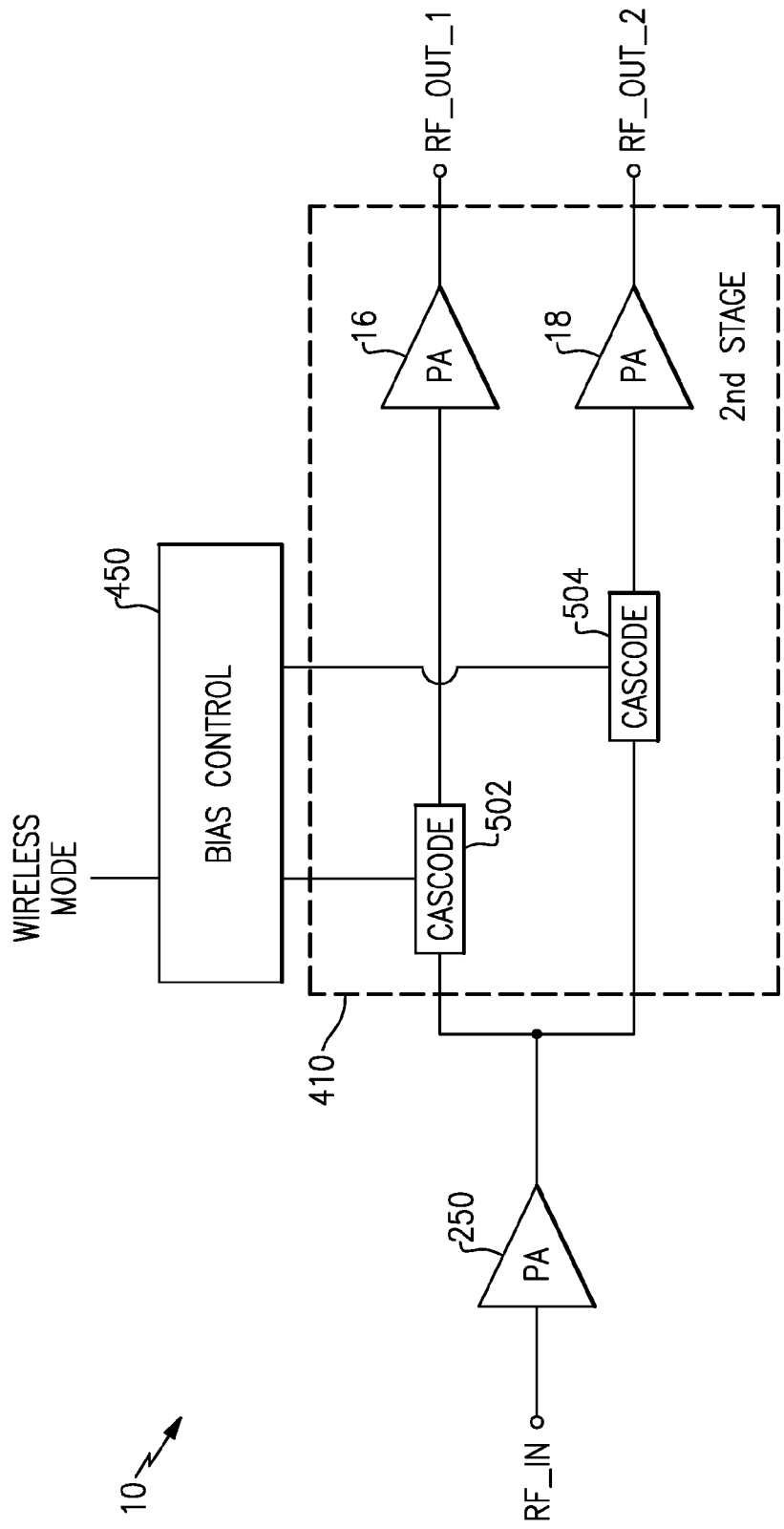
FIG. 9 is a schematic diagram of a power amplifier system that includes a multi-stage power amplifier with a cascode circuit between power amplifier stages according to an embodiment.

FIG. 9 is a schematic diagram of a power amplifier system 10 that includes a multi-stage power amplifier with a cascode circuit between power amplifier stages according to an embodiment. As illustrated, the power amplifier system 10 includes the power amplifier 250, the bias control 450, and the output network 410. The output network 410 includes the cascode elements 502 and 504, and a second power amplifier stage including a first portion 16 and a second portion 18. Also, the first portion 16 and the second portion 18 can be amplifiers or power amplifiers. The power amplifier system 10 can be configured to transmit wireless local area network (WLAN) signals in certain implementations. The power amplifier system 10 can include more elements than illustrated in FIG. 9 and/or some embodiments can include a subset of the illustrated elements. The power amplifier system 10 can be implemented on a single die.

The power amplifier 250 is configured to amplify an RF signal RF_IN and provide an amplified RF signal. The power amplifier 250 can include any suitable RF power amplifier transistor. For instance, the first power amplifier stage 12 can be implemented by one or more bipolar transistors, such as one or more SiGe bipolar transistors or one or more GaAs heterojunction bipolar transistors (HBTs). The power amplifier stage 250 can be deactivated as desired. For instance, a bias signal (not illustrated in FIG. 9) provided to the power amplifier 250 can deactivate the power amplifier 950 when the amplified RF signal provided by the power amplifier 250 is not being used.

The multi-stage power amplifier of FIG. 9 is arranged for operating in more than one mode of operation. The cascode elements 502 and 504 can selectively provide the output of the power amplifier 250 to the first portion 16 of the second power amplifier stage and/or the second portion 18 of the second power amplifier stage. The cascode elements 502 and 504 can serve as switches to provide the RF output signal from the power amplifier 250 to a selected portion of the second power amplifier stage.

Figure 10:
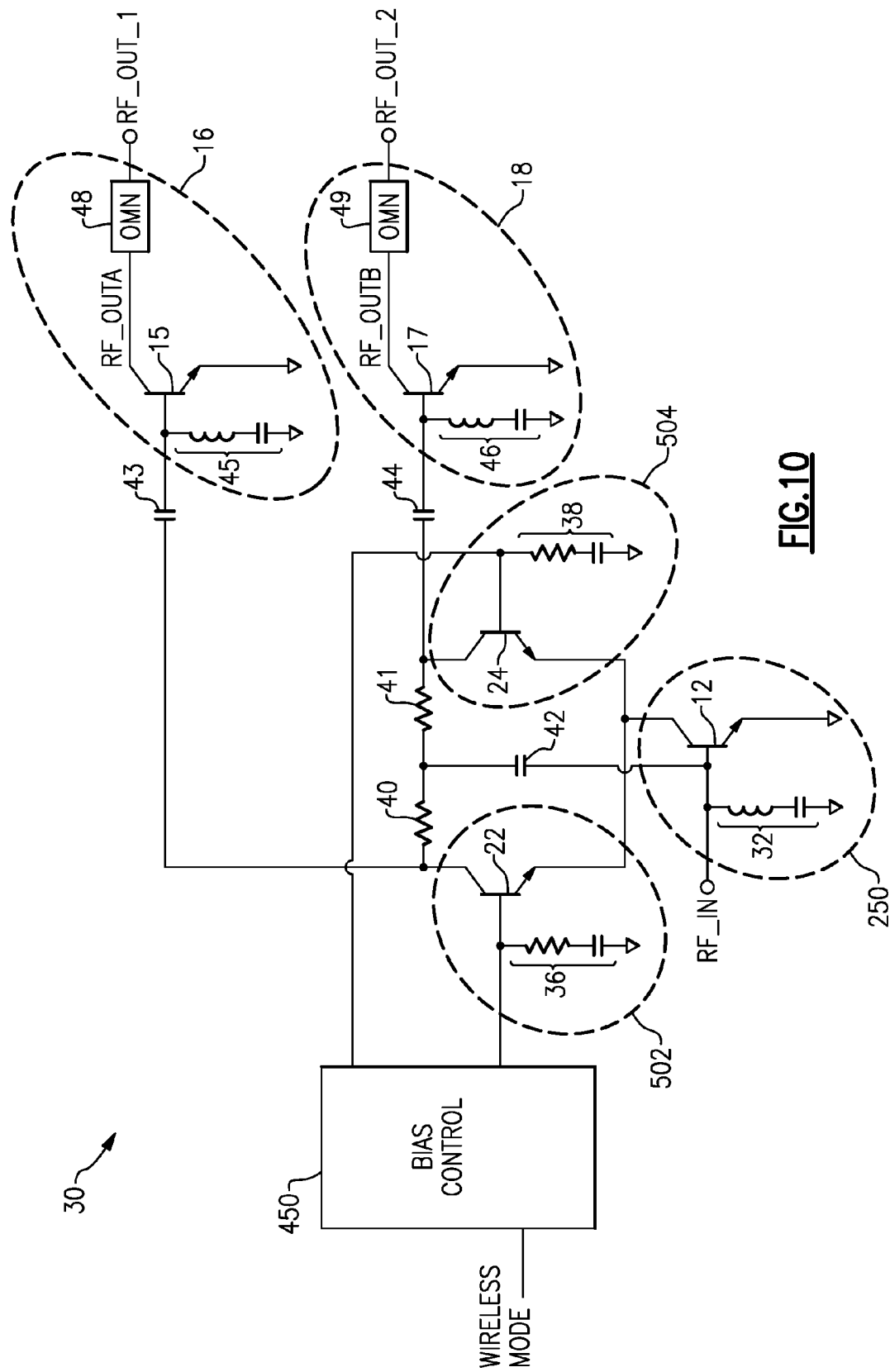
FIG. 10 is a schematic diagram of a power amplifier system that includes a multi-stage power amplifier with a cascode circuit between power amplifier stages according to an embodiment.

FIG. 10 is a schematic diagram of a power amplifier system 30 that includes a multi-stage power amplifier with a cascode circuit between power amplifier stages according to an embodiment. The power amplifier system 30 can be a circuit realization for the PA 250, the cascode elements 502, 504, and the first and second portions 16, 18 of a second amplifier stage. With reference to FIG. 9, the power amplifier system 30 shows an example of the power amplifier system 10 and also illustrates corresponding output matching networks. As illustrated, the power amplifier system 30 has a bipolar junction transistor (BJT) 12, cascode BJTs 22 and 24, a first portion 16 and a second portion 18 of a second power amplifier stage, the bias control circuit 450, termination circuits 32, 36, 38, 45, and 46, a feedback circuit including resistors 40 and 41 and a capacitor 42, capacitors 43 and 44, and output matching networks 48 and 49. The power amplifier system 30 can include more elements than illustrated in FIG. 10 and/or some embodiments can include a subset of the illustrated elements. The power amplifier system 30 can be implemented on a single die in certain embodiments.

As illustrated, the power amplifier 250 includes the BJT 12 and the termination circuit 32. The cascode element 502 includes the BJT 22 and the termination circuit 36, and the cascode element 504 includes the BJT 24 and the termination circuit 38. The first portion 16 includes the BJT 15 and the termination circuit 45, and the second portion 18 includes the BJT 17 and the termination circuit 46. Although the illustrated power amplifier system 30 uses NPN BJTs, it will be understood that the principles and advantages discussed herein can be applied to power amplifier systems using PNP BJTs. As shown in FIG. 10, the PA 250 can be configured as a common emitter amplifier for amplifying an RF signal RF_IN received at its base. The termination circuit 32 can provide impedance matching at the base of the BJT 12. The termination circuit 32 can be implemented by one or more suitable passive circuit elements disposed between the base of the BJT 12 and a reference voltage, such as aground. As illustrated the termination circuit is a series LC circuit. The emitter of the BJT 12 can be electrically connected to ground or another suitable reference voltage. The collector of the BJT 12 can be electrically connected to the cascode circuits 502 and 504. As illustrated, the collector of the BJT 12 is electrically connected to the emitter of the BJT 22 and the emitter of the BJT 24.

In FIG. 10, the cascode elements 502 and 504 are implemented by bipolar transistors. Accordingly, the cascode elements 502 and 504 can selectively provide an RF signal from the collector of the BJT 12 to a selected portion of the first and second porions 16, 18 of the second stage amplifier. This can implement a switching functionality in bipolar technology. The switching functionality performed by the bipolar cascode circuit can achieve suitable performance for switching RF signals when field effect transistors or other switching elements are unavailable to perform the switching functionality. Advantageously, the power amplifier system 30 can be formed on a single die using a bipolar process. Although the illustrated cascode elements 502 and 504 use NPN BJTs, it will be understood that the principles and advantages discussed herein can use PNP BJTs and/or a combination of NPN and PNP BJTs. The BJT 22 and the BJT 24 can be configured as common base amplifiers. As illustrated, the BJT 22 has an emitter configured to receive an RF signal from the collector of the BJT 12 of the PA 250, a base configured to receive a first signal from the bias control circuit 450, and a collector configured to provide an RF signal to the first portion 16 of the second power amplifier stage. A termination circuit 36 is electrically connected to the base of the BJT 22. The termination circuit 36 can include a series RC circuit electrically connected between the base of the BJT 22 and a reference voltage, such as ground. The resistor of the series RC circuit can provide a controlled impedance to ensure stability. The capacitor of the series RC circuit can serve as a decoupling capacitor that provides a terminating impedance for RF signals.

The BJT 24 of FIG. 10 is also cascoded as a common-base amplifier. As illustrated, the BJT 24 has an emitter configured to receive an RF signal from the collector of the BJT 12 of the PA 250, a base configured to receive a second signal from the bias generator circuit 34, and a collector configured to provide an RF signal to the second portion 18 of the second power amplifier stage. A termination circuit 38 is electrically connected to the base of the BJT 24. The termination circuit 38 can include a series RC circuit electrically connected between the base of the BJT 24 and a reference voltage, such as ground.

The bias control circuit 450 can generate the first signal and the second signal. The bias control circuit 450 can generate these signals based at least partly on an indication of a mode of operation of the power amplifier system 30. The first signal and the second signal can be direct current (DC) signals. These signals can be provided to respective bases of cascode transistors via resistors having relatively low impedances. The first signal can be the logical complement of the second signal in certain embodiments. Accordingly, one of the BJT 22 or the BJT 24 can be on and the other can be off in such embodiments. The signal level of the first signal and the second signal can control whether the BJT 22 and the BJT 24, respectively, are on or off. In one implementation, the first bias signal and the second bias signal can provide about a 400 mV difference between bases of the BJT 22 and the BJT 24. The base of one BJT, either BJT 22 or BJT 24, can be at about +200 mV and the base of the other, either BJT 22 or BJT 24, can be at about −200 mV. The base of the amplifier bipolar transistor can receive feedback from at least one of the collectors of the cascode bipolar transistors. As illustrated in FIG. 10, resistors 40 and 41 are arranged in series between the collectors of the BJTs 22 and 24. These resistors can help with stability. The capacitor 42 can be electrically connected between the base of the BJT 12 and an intermediate node between the resistors 40 and 41. The capacitor 42 can provide RF feedback from the cascode elements 502 and 504 to the base of the common emitter amplifier of the BJT 12 of the PA 250.

The first portion 16 of the second power amplifier stage is configured to receive an RF signal from the BJT 22. This RF signal can be received by way of the capacitor 43 as shown in FIG. 10. In FIG. 10, the first portion 16 of the second stage of the power amplifier is a bipolar power amplifier transistor having a base configured to receive an RF signal from the collector of the BJT 22 and provide an amplified RF signal at its collector. The BJT 15 can have an emitter electrically connected to ground by way of a through wafer via in certain embodiments. A termination circuit 45 can be electrically connected to the base of the power amplifier transistor. The termination circuit 45 can be electrically connected to ground by way of a through wafer via in certain embodiments. As illustrated, the output matching network 48 is electrically connected to the collector of the BJT 15. The output matching network 48 can be arranged to provide output matching for a particular mode of operation of the power amplifier system. The output matching network 48 can include, for example, one or more series LC circuits electrically connected between the collector of the first power amplifier transistor and ground and one or more parallel LC circuits electrically connected in series between the collector of the first power amplifier transistor and an electrical component in an RF signal path.

The second portion 18 of the second power amplifier stage can be functionally similar to the first power amplifier portion 16. The second portion 18 of the second power amplifier stage can receive an RF signal when the BJT 24 is providing an RF signal from the first stage 16 of the power amplifier. The BJT 15 of the first portion 16 can be referred to as a first power amplifier transistor and the BJT 17 of the second portion 18 can be referred to as a second power amplifier transistor. The second portion 18 can be implemented by a bipolar power amplifier transistor having a different emitter area than the first portion 16. For instance, each of these power amplifier transistors can be implemented by arrays of smaller transistors and the array sizes for the first portion 16 and the second portion 18 can be different. As one example, the second portion 18 can have an emitter area that is up to about 5 times bigger than the first portion 16. When the second portion 18 has a larger emitter area than the first portion 16, the second portion 18 can provide better performance for a higher power mode and the first portion 16 can provide better performance for a lower power mode. The termination circuits 45 and 46 can provide different termination impedances for operating in different modes of operation. As illustrated, the termination circuits 45 and 46 can each include a series LC circuit in certain applications.

The matching network 49 together with the second power amplifier transistor of the second stage can be arranged to meet performance criteria for high power mode or another mode of operation. Similarly, the matching network 48 together with the first power amplifier transistor can be arranged to meet performance criteria associated with a different mode of operation than the second power amplifier transistor and the matching network 49, such as a low power mode. The bias control circuit 450 and the BJTs 22 and 24 can provide an RF signal amplified by the first stage 12 to a particular power amplifier transistor depending on the mode of operation.

Figure 11:
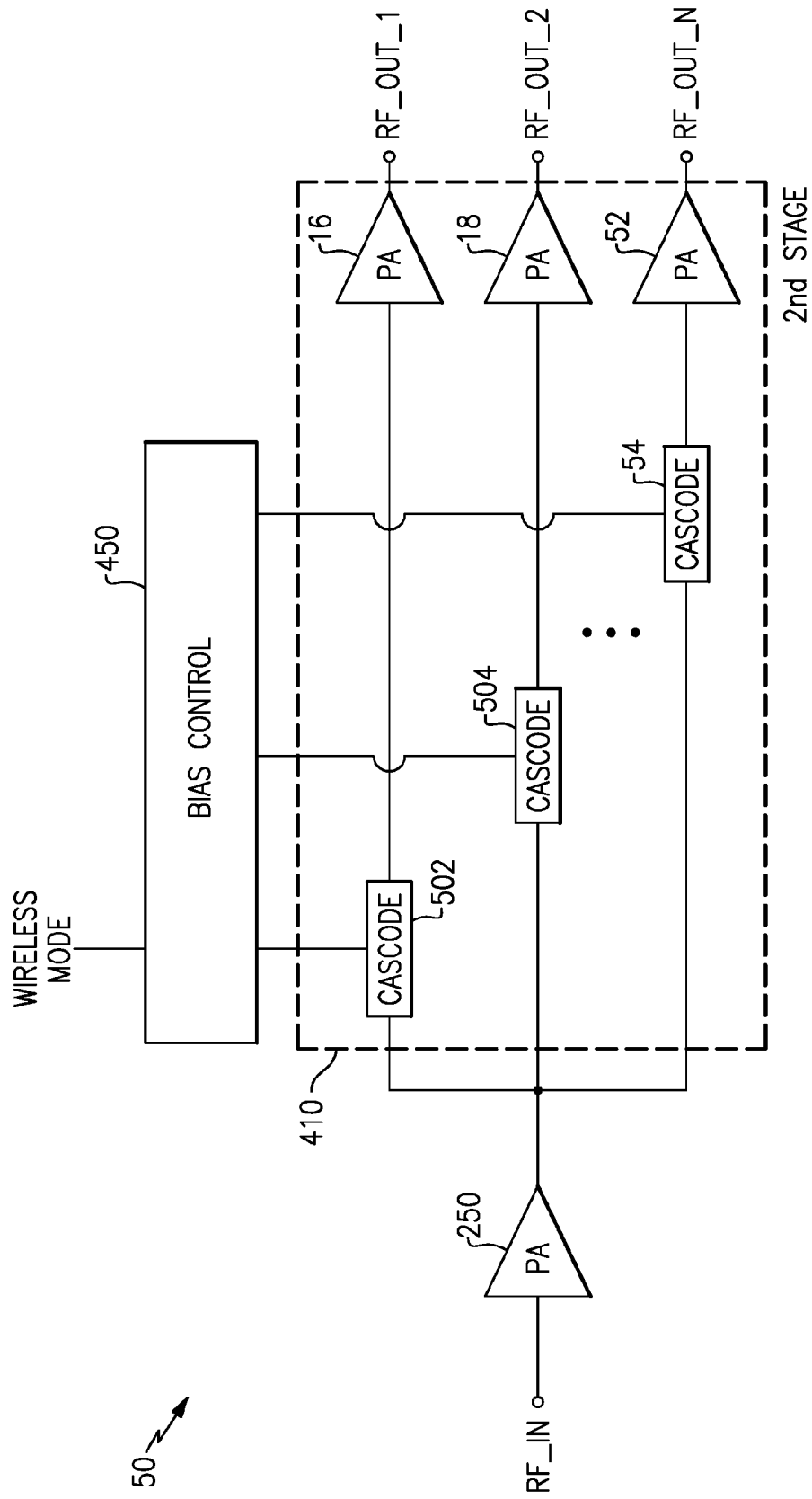
FIG. 11 is a schematic diagram of a power amplifier system that includes a multi-stage power amplifier with a cascode circuit between power amplifier stages according to an embodiment.

FIG. 11 is a schematic diagram of a power amplifier system 50 that includes a multi-stage power amplifier with the output network 410 between power amplifier stages according to an embodiment. The power amplifier system 50 is like the power amplifier system 10 of FIG. 9 except that it includes more than two portions of the second stage that can be selectively enabled. The power amplifier system 50 can include more elements than illustrated in FIG. 11 and/or some embodiments can include a subset of the illustrated elements. The power amplifier system 50 can be implemented on a single die.

In certain embodiments, an output network 410 can include a plurality of different multi-stage power amplifiers. According to some embodiments, a multi-stage power amplifier can include at least three stages and a cascode element can function as a switch between a first stage and a second stage and another cascode element can function as a switch between the second stage and a third stage. Moreover, as used herein a first stage of a power amplifier can refer to one stage of a multi-stage power amplifier and a second stage of a power amplifier can refer to a subsequent stage of the multi-stage power amplifier that receives an input from the first stage.

Figure 12A:
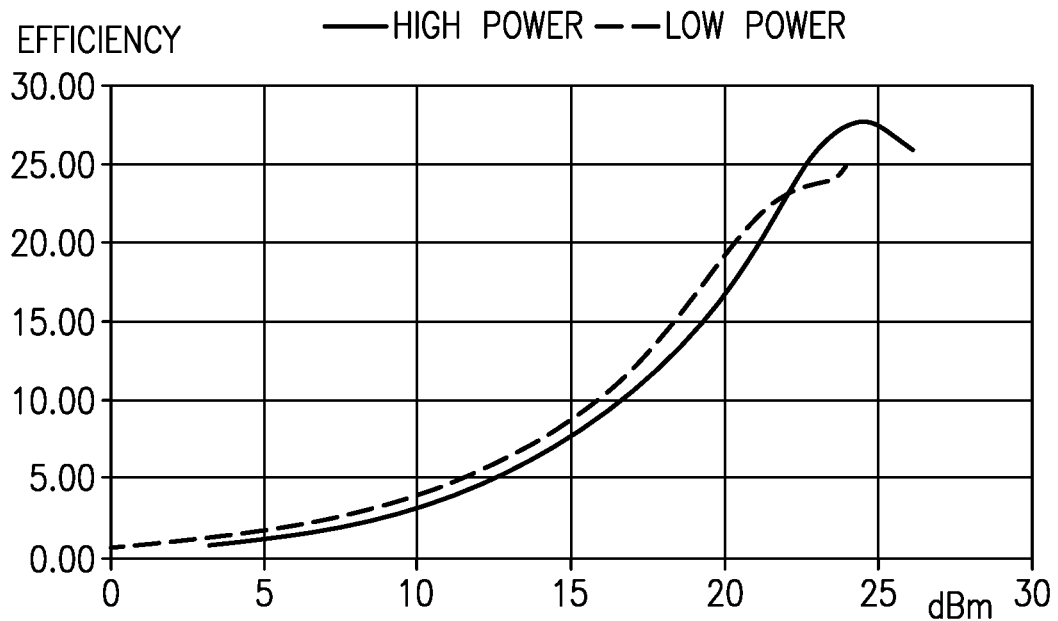
FIG. 12A is graph comparing efficiency in high power mode to efficiency in low power mode for a conventional power amplifier in which low power mode is implemented by reducing the area of a low power output power amplifier transistor relative to a high power output power amplifier transistor.
Figure 12B:
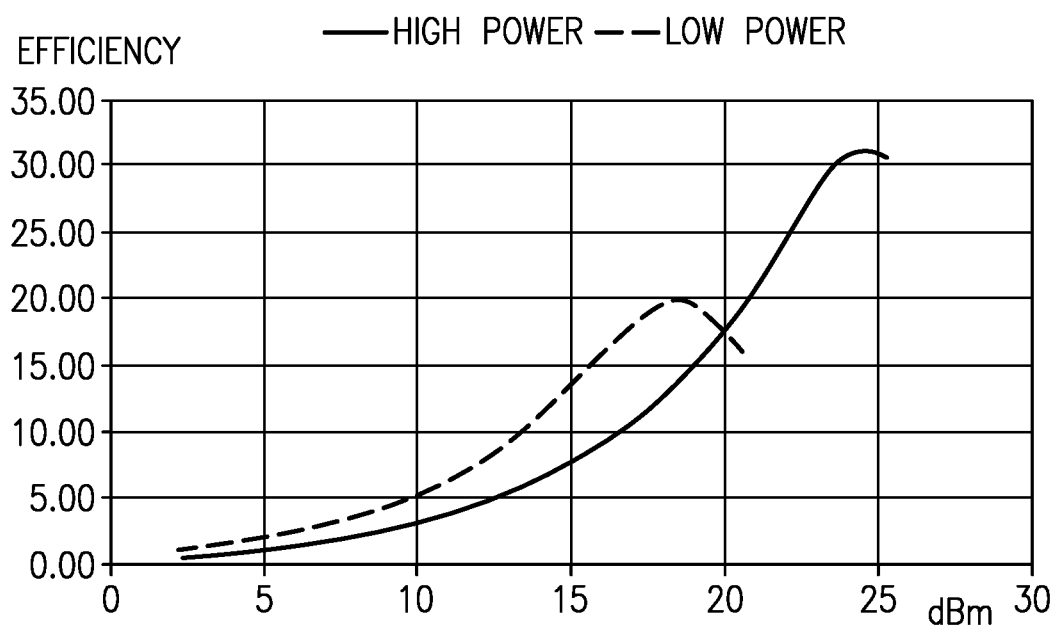
FIG. 12B is graph comparing efficiency in high power mode to efficiency in low power mode for a power amplifier with a cascode circuit between power amplifier stages according to an embodiment.

FIGS. 12A and 12B provide a comparison between efficiency of a conventional wireless local area network (WLAN) power amplifier and efficiency of a cascode switched power amplifier according to an embodiment. The curves in FIGS. 4A and 4B represent efficiency of a power amplifier as a function of output power for different power modes of operation.

FIG. 12A is graph comparing efficiency in high power mode to efficiency in low power mode for a conventional power amplifier in which low power mode is implemented by reducing the area of a low power output power amplifier transistor relative to a high power output power amplifier transistor. The curves in FIG. 12A indicate that efficiency can improve from about 7% for high power mode to about 8% for low power mode at 15 dBm.

FIG. 12B is graph comparing efficiency in high power mode to efficiency in low power mode for a power amplifier with a cascode circuit between power amplifier stages according to an embodiment. The low power curve in FIG. 12B corresponds to using a cascode transistor to drive an optimized low power output stage. The curves in FIG. 12B indicate that efficiency can improve from about 7% for high power mode to about 14% for low power mode at 15 dBm.

While some features have been discussed with reference to various power modes such as low power mode and high power mode for illustrative purposes, the principles and advantages discussed herein can be applied to any different modes. Such modes can include, for example, modes associated with different frequency bands, modes associated with different frequency bands and different power modes, different signaling modes (e.g., a nominal mode and an intermittent signaling mode such as a public safety mode like an NS_07 mode), the like, or any combination thereof.

Although some features have been discussed with reference to power amplifiers for illustrative purposes, the principles and advantages discussed herein can be applied to any application that can benefit from using bipolar transistors and/or cascode transistors to implement a switch functionality. As one example, an apparatus can include an amplifier bipolar transistor, a first load, a second load, and a cascode circuit including a first cascode bipolar transistor and a second cascode bipolar transistor. In this example, the first cascode bipolar transistor can selectively provide an output from the amplifier bipolar transistor to the first load transistor and the second cascode bipolar transistor can selectively provide the output from the amplifier bipolar transistor to the second load. As another example, any of the cascode circuits discussed herein can be implemented between stages of a multi-stage RF amplifier.

In certain embodiments, the first power amplifier stage 12, the cascode circuit 14 or 14', and the second power amplifier stage 16 can be integrated on a single die to form a packaged power amplifier module. One or more other components can be included on the single die. The die can be encapsulated in plastic. The single die can be a SiGe die or a HBT GaAs die, for example. The packaged power amplifier module can be, for example, mounted to a RF circuit board associated with the wireless device 511 of FIG. 14.

Figure 13A:
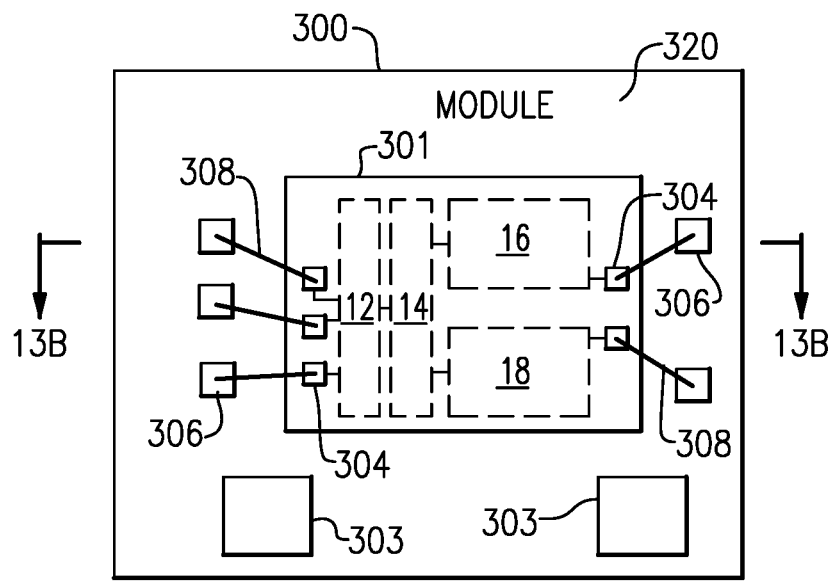
FIG. 13A is a schematic diagram of one example of a packaged power amplifier module according to an embodiment.
Figure 13B:
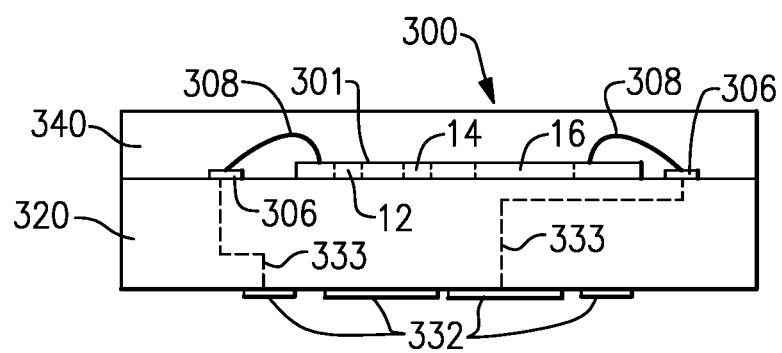
FIG. 13B is a schematic diagram of a cross-section of the packaged power amplifier module of FIG. 12 taken along the lines 5B-5B.

FIG. 13A is a schematic diagram of one example of a packaged power amplifier module 300. The power amplifier 300 can include more elements than illustrated and/or or subset of the illustrated elements. FIG. 13B is a schematic diagram of a cross-section of the packaged power amplifier module 300 of FIG. 13A taken along the lines 5B-5B.

The packaged power amplifier module 300 includes an integrated circuit (IC) or die 301, surface mount components 303, wirebonds 308, a package substrate 320, and encapsulation 340. The package substrate 320 includes pads 306 formed from conductors disposed therein. Additionally, the die 301 includes pads 304, and the wirebonds 308 have been used to electrically connect the pads 304 of the die 301 to the pads 306 of the package substrate 301. As illustrated in FIGS. 5A and 5B, the die 301 includes the first amplifier stage 12, the cascode circuit 14, and the second power amplifier stage 16 formed therein.

The packaging substrate 320 can be configured to receive a plurality of components such as the die 301 and the surface mount components 303, which can include, for example, surface mount capacitors and/or inductors.

As shown in FIG. 13B, the packaged power amplifier module 300 is shown to include a plurality of contact pads 332 disposed on the side of the packaged power amplifier module 300 opposite the side used to mount the die 301. Configuring the packaged power amplifier module 300 in this manner can aid in connecting the packaged power amplifier module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 13B, the electrical connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged power amplifier module 300 can also include one or more packaging structures to, for example, provide protection and/or to facilitate handling of the packaged power amplifier module 300. Such a packaging structure can include overmold or encapsulation 340 formed over the packaging substrate 320 and the components and die(s) disposed thereon.

It will be understood that although the packaged power amplifier module 300 is described in the context of wirebond-based electrical connections, one or more features of the present disclosure can also be implemented in other packaging configurations, including, for example, flip-chip configurations.

Figure 14:
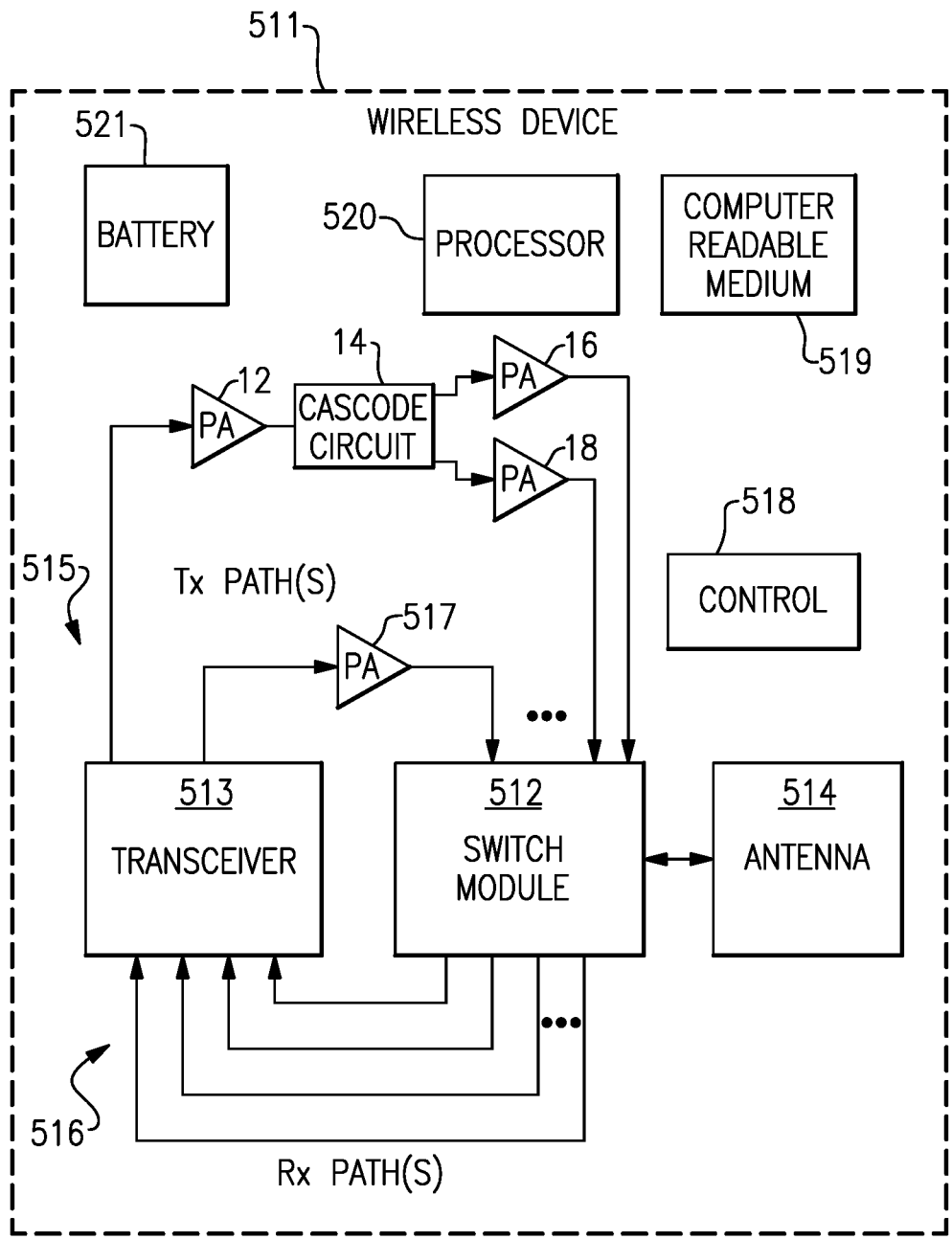
FIG. 14 is a schematic block diagram of an example mobile device that include power amplifiers with cascode circuits in accordance with any of the embodiments of FIGS. 9, 10, and/or 11.

FIG. 14 is a schematic block diagram of an example wireless or mobile device 511 that can include one or more of the power amplifiers. The wireless device 511 can include a multi-stage power amplifier with a cascode circuit in accordance with the principles advantages discussed herein, for example, with reference to FIGS. 1 to 3. The wireless device 511 can include one or more power amplifier modules, such as one or more power amplifier modules having any combination of features discussed with reference to FIGS. 5A and 5B.

The example wireless device 511 depicted in FIG. 14 can represent a multi band and/or multi-mode device such as a multi-band/multi-mode mobile phone. In certain embodiments, the wireless device 511 can include a switch module 512, a transceiver 513, an antenna 514, the first power amplifier stage 12, the cascode circuit 14, the second power amplifier stage 16, one or more other power amplifiers 517, a control component 518, a computer readable medium 519, a processor 520, and a battery 521.

The transceiver 513 can generate RF signals for transmission via the antenna 514. Furthermore, the transceiver 513 can receive incoming RF signals from the antenna 514.

It will be understood that various functionalities associated with the transmission and receiving of RF signals can be achieved by one or more components that are collectively represented in FIG. 14 as the transceiver 513. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 14 as the antenna 514. For example, a single antenna can be configured to provide both transmitting and receiving functionalities. In another example, transmitting and receiving functionalities can be provided by separate antennas. In yet another example, different bands associated with the wireless device 511 can be provided with different antennas.

In FIG. 14, one or more output signals from the transceiver 513 are depicted as being provided to the antenna 514 via one or more transmission paths 515. In the example shown, different transmission paths 515 can represent output paths associated with different bands and/or different power outputs. For instance, a multi-stage power amplifier including the first stage 12 and the second stage 16 and another power amplifier 517 can represent amplifications associated with different power output configurations (e.g., low power output and high power output), and/or amplifications associated with different bands. Moreover, each of these power amplifiers can include output stages configured to amplify RF signals for particular power modes of operation (e.g., low power output and high power output) and/or amplify signals associated with different frequency bands (e.g., low power, high frequency output; lower power, low frequency output; high power, high frequency output; and high power, low frequency output).

Although FIG. 14 illustrates a configuration using two transmission paths 515, the wireless device 511 can include more or fewer transmission paths 515.

The illustrated power amplifiers can be used to amplify a wide variety of RF signals. For example, one or more of the power amplifiers can receive an enable signal that can be used to pulse the output of the power amplifier to aid in transmitting a wireless local area network (WLAN) signal, such as a WLAN 802.11g signal, or any other suitable pulsed signal. In certain embodiments, one or more of the power amplifiers are configured to amplify a Wi-Fi signal. Each of the power amplifiers need not amplify the same type of signal. For example, one power amplifier can amplify a WLAN signal, while another power amplifier can amplify, for example, a Global System for Mobile (GSM) signal, a code division multiple access (CDMA) signal, a W-CDMA signal, a Long Term Evolution (LTE) signal, an EDGE signal, or a Bluetooth signal One or more features of the present disclosure can be implemented in the foregoing example communication standards, modes and/or bands, and in other communication standards.

In FIG. 14, one or more detected signals from the antenna 514 are depicted as being provided to the transceiver 513 via one or more receiving paths 516. In the example shown, different receiving paths 516 can represent paths associated with different bands. Although FIG. 14 illustrates a configuration using four receiving paths 516, the wireless device 511 can be adapted to include more or fewer receiving paths 516.

To facilitate switching between receive and transmit paths, the switch module 512 can be configured to electrically connect the antenna 514 to a selected transmit or receive path. Thus, the switch module 512 can provide a number of switching functionalities associated with an operation of the wireless device 511. In certain embodiments, the switch module 512 can include a number of switches configured to provide functionalities associated with, for example, switching between different bands, switching between different power modes, switching between transmission and receiving modes, or any combination thereof. The switch module 512 can also be configured to provide additional functionality, including filtering and/or duplexing of signals.

FIG. 14 shows that in certain embodiments, a control component 518 can be provided for controlling various control functionalities associated with operations of the switch module 512, the power amplifiers, and/or other operating component(s). The control component 518 can be implemented on the same die as a power amplifier in certain implementations. The control component 518 can be implemented on a different die than the power amplifier in some implementations. The control component 518 can include a control and biasing circuit to bias the cascode circuit 14.

In certain embodiments, a processor 520 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory 519 that can direct a computing device or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide instructions for implementing the acts specified in the flowchart and/or block diagram block or blocks.

The battery 521 can be any suitable battery for use in the wireless device 511, including, for example, a lithium-ion battery.

Some of the embodiments described above have provided examples in connection with power amplifiers and/or mobile devices. However, the principles and advantages of the embodiments can be used for any other systems or apparatus, such as any uplink cellular device, that could benefit from any of the circuits described herein. The teachings herein are applicable to a variety of power amplifier systems including systems with multiple power amplifiers, including, for example, multi band and/or multi mode power amplifier systems. The principles and advantages of the embodiments can be used for any other systems or apparatus that could benefit from a cascode circuit between power amplifier stages.

Additional Embodiments; Terminology

While various embodiments of FEMs have been described, it will be apparent to those of ordinary skill in the art that many more embodiments and implementations are possible. For example, embodiments of FEMs are applicable to different types of wireless communication devices, incorporating various FEM components. In addition, embodiments of integrated FEMs are applicable to systems where compact, high-performance design is desired. Some of the embodiments described herein can be utilized in connection with wireless devices such as mobile phones. However, one or more features described herein can be used for any other systems or apparatus that utilize of RF signals.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description of Certain Embodiments using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A multi-mode radiofrequency module comprising:
   a semiconductor die;
   a power amplifier including a first bipolar junction transistor implemented on the die and configured to generate an amplified radiofrequency signal;
   second and third bipolar junction transistors implemented on the die and each arranged in a cascode configuration with respect to the first bipolar junction transistor, the second and third bipolar junction transistors being turned on and off respectively in a first radiofrequency mode to output the amplified radiofrequency signal on the second bipolar junction transistor, and being turned off and on respectively in a second radiofrequency mode to output the amplified radiofrequency signal on the third bipolar junction transistor; and
   an antenna switching module having an antenna port and configured to, in the first radiofrequency mode, couple the output from the second bipolar junction transistor to the antenna port for transmission via an antenna and to, in the second radiofrequency mode, couple the output of the third bipolar junction transistor to the antenna port for transmission via the antenna.

2. The multi-mode radiofrequency module of claim 1 wherein the second bipolar junction transistor and the third bipolar junction transistor are each arranged as a common base amplifier.

3. The multi-mode radiofrequency module of claim 1 further comprising a bias control circuit configured to control the second and third bipolar junction transistors responsive to a control signal indicative of the first radiofrequency mode or the second radiofrequency mode.

4. The multi-mode radiofrequency module of claim 1 wherein the first radiofrequency mode is a Bluetooth mode, and the second radiofrequency mode is a WiFi mode.

5. The multi-mode radiofrequency module of claim 1 further comprising a radiofrequency switch having first and second radiofrequency inputs, a switch control input, and a radiofrequency output, the radiofrequency switch configured to respond to a radiofrequency mode control signal received on the switch control input to selectively couple one of the first and second radiofrequency inputs of the switch to the radiofrequency output of the switch, the radiofrequency output of the switch coupled to a radiofrequency input of the power amplifier.

6. The multi-mode radiofrequency module of claim 1 wherein the antenna switching module is further configured in a third radiofrequency mode to couple a radio frequency signal that does not pass through the power amplifier to the antenna port for transmission via the antenna.

7. The multi-mode radiofrequency module of claim 6 wherein a radiofrequency transmit signal provided on a port of the multi-mode module has a significantly different maximum power output when the multi-mode module is operating in each of the first, second, and third radiofrequency modes.

8. The multi-mode radiofrequency module of claim 1 further comprising a radiofrequency receive path including a receive path amplifier, the radiofrequency receive path configured to operate in either of a first receive mode, in which a receive signal output by the receive path is amplified by the receive path amplifier, and a second receive mode, in which the receive signal output by the receive path is not amplified by the receive path amplifier.

9. The multi-mode radiofrequency module of claim 8 wherein the receive path amplifier is a low noise amplifier.

10. The multi-mode radiofrequency module of claim 9 wherein circuitry in the radiofrequency receive path determines whether to operate in the first receive mode or the second receive mode based at least in part on a radiofrequency receive signal strength.

11. The multi-mode radiofrequency module of claim 1 further comprising dynamically configurable impedance matching circuitry configured to adjust an output impedance of the power amplifier based on the current radiofrequency mode of the multi-mode radiofrequency module.

12. The multi-mode radiofrequency module of claim 1 wherein the first radio frequency mode corresponds to a first local area network wireless standard, the second radio frequency mode corresponds to a second local area network wireless network standard, and the multi-mode module is incorporated on a mobile phone capable of supporting at least a third radiofrequency mode corresponding to a wide area network standard.

13. The multi-mode radiofrequency module of claim 12 wherein the third wireless technology standard is a Long-Term Evolution standard.

14. The multi-mode radiofrequency module of claim 1 wherein the first bipolar junction transistor receives stabilizing feedback from at least one of the second and third bipolar junction transistors.

15. The multi-mode radiofrequency module of claim 14 wherein a feedback path for the stabilizing feedback is between a collector of the second bipolar junction transistor and a base of the first bipolar junction transistor.

16. A wireless device comprising:
a semiconductor die;
a power amplifier implemented on the die, the power amplifier including a first bipolar junction transistor configured to generate an amplified radiofrequency signal,
second and third bipolar junction transistors implemented on the die and each arranged in a cascode configuration with respect to the first bipolar junction transistor, the second and third bipolar junction transistors being turned on and off respectively in a first radiofrequency mode to output the amplified radiofrequency signal on the second bipolar junction transistor, and being turned off and on respectively in a second radiofrequency mode to output the amplified radiofrequency signal on the third bipolar junction transistor;
an antenna configured to wirelessly transmit a signal; and
an antenna switching module having an antenna port and configured to, in the first radiofrequency mode, couple the output from the second bipolar junction to the antenna port for transmission via the antenna and to, in the second radiofrequency mode, couple the output of the third bipolar junction transistor to the antenna port for transmission via the antenna.

17. The wireless device of claim 16 wherein the first bipolar junction transistor receives stabilizing feedback from at least one of the second and third bipolar junction transistors.

18. The wireless device of claim 17 wherein a feedback path for the stabilizing feedback is between a collector of the second bipolar junction transistor and a base of the first bipolar junction transistor.

19. A wireless device comprising:
a semiconductor die;
a first bipolar junction transistor implemented on the die and configured to generate an amplified radiofrequency signal;
second and third bipolar junction transistors implemented on the die and each arranged in a cascode configuration with respect to the first bipolar junction transistor, the second and third bipolar junction transistors being turned on and off respectively in a first radiofrequency mode to output the amplified radiofrequency signal on the second bipolar junction transistor, and being turned off and on respectively in a second radiofrequency mode to output the amplified radiofrequency signal on the third bipolar junction transistor; and
an antenna switch having an antenna port and configured to, in the first radiofrequency mode, couple the output from the second bipolar junction to the antenna port for transmission via an antenna and to, in the second radiofrequency mode, couple the output of the third bipolar junction transistor to the antenna port for transmission via the antenna.

20. The wireless device of claim 19 wherein the first bipolar junction transistor receives stabilizing feedback from at least one of the second and third bipolar junction transistors.

21. The wireless device of claim 20 wherein a feedback path for the stabilizing feedback is between a collector of the second bipolar junction transistor and a base of the first bipolar junction transistor.

* * * * *